(12) United States Patent
Kaseya

(10) Patent No.: US 11,239,390 B2
(45) Date of Patent: Feb. 1, 2022

(54) LIGHT EMITTING APPARATUS, PROJECTOR, METHOD FOR MANUFACTURING LIGHT EMITTING APPARATUS

(71) Applicant: Seiko Epson Corporation, Tokyo (JP)

(72) Inventor: Hiroyasu Kaseya, Fujimi (JP)

(73) Assignee: Seiko Epson Corporation

( * ) Notice: Subject to any disclaimer, the term of this patent is extended or adjusted under 35 U.S.C. 154(b) by 18 days.

(21) Appl. No.: 16/618,088

(22) PCT Filed: May 23, 2018

(86) PCT No.: PCT/JP2018/019841
§ 371 (c)(1),
(2) Date: Nov. 27, 2019

(87) PCT Pub. No.: WO2018/221351
PCT Pub. Date: Dec. 6, 2018

(65) Prior Publication Data
US 2020/0152833 A1 May 14, 2020

(30) Foreign Application Priority Data
May 31, 2017 (JP) .............................. JP2017-108346

(51) Int. Cl.
*H01L 33/24* (2010.01)
*H01L 33/00* (2010.01)
(Continued)

(52) U.S. Cl.
CPC .......... *H01L 33/24* (2013.01); *H01L 33/0095* (2013.01); *H01L 33/08* (2013.01);
(Continued)

(58) Field of Classification Search
CPC ..... H01L 33/24; H01L 33/0095; H01L 33/08; H01L 33/38; H01L 33/62; H01L 2933/003
(Continued)

(56) References Cited

U.S. PATENT DOCUMENTS

2005/0227391 A1* 10/2005 Jin .......................... H01L 33/24
438/22
2007/0194327 A1 8/2007 Ueda et al.
(Continued)

FOREIGN PATENT DOCUMENTS

| JP | 2000261088 A | 9/2000 |
| JP | 2005-303301 A | 10/2005 |

(Continued)

*Primary Examiner* — Igwe U Anya
(74) *Attorney, Agent, or Firm* — Harness, Dickey & Pierce, P.L.C.

(57) ABSTRACT

A light emitting apparatus including a light emitting device including a first base at which a laminate is provided, a second base at which the light emitting device is provided, and a first member provided between the first base and the second base, wherein the laminate includes a light emitter, the light emitter includes a first semiconductor layer, a second semiconductor layer of a conductivity type different from the conductivity type of the first semiconductor layer, and a light emitting layer provided between the first semiconductor layer and the second semiconductor layer and capable of emitting light when current is injected into the light emitting layer, the first member has one end connected to the first base and another end connected to the second base, and the laminate is connected to the second base on the side opposite the first base.

12 Claims, 10 Drawing Sheets

(51) Int. Cl.
*H01L 33/08* (2010.01)
*H01L 33/38* (2010.01)
*H01L 33/62* (2010.01)

(52) U.S. Cl.
CPC .............. *H01L 33/38* (2013.01); *H01L 33/62* (2013.01); *H01L 2933/0033* (2013.01)

(58) Field of Classification Search
USPC ........................................................ 257/95
See application file for complete search history.

(56) References Cited

U.S. PATENT DOCUMENTS

| | | | |
|---|---|---|---|
| 2008/0224167 A1 | 9/2008 | Kuwata et al. | |
| 2010/0038670 A1* | 2/2010 | Panaccione | H01L 33/58 |
| | | | 257/98 |
| 2010/0117070 A1* | 5/2010 | Adekore | H01L 21/02403 |
| | | | 257/43 |
| 2011/0169025 A1 | 7/2011 | Kishino et al. | |
| 2012/0229773 A1* | 9/2012 | Mochizuki | H01L 33/24 |
| | | | 353/30 |
| 2013/0043499 A1 | 2/2013 | Ohta et al. | |
| 2015/0021626 A1 | 1/2015 | Nakamura et al. | |
| 2015/0091042 A1 | 4/2015 | Kim et al. | |

FOREIGN PATENT DOCUMENTS

| | | |
|---|---|---|
| JP | 2007-235122 A | 9/2007 |
| JP | 2008047850 A | 2/2008 |
| JP | 2008-227404 A | 9/2008 |
| JP | 2009-252777 A | 10/2009 |
| JP | 2010-153561 A | 7/2010 |
| JP | 2013042079 A | 2/2013 |
| JP | 2013-239718 A | 11/2013 |
| WO | WO-2013161208 A1 | 10/2013 |

* cited by examiner

[Fig. 1]
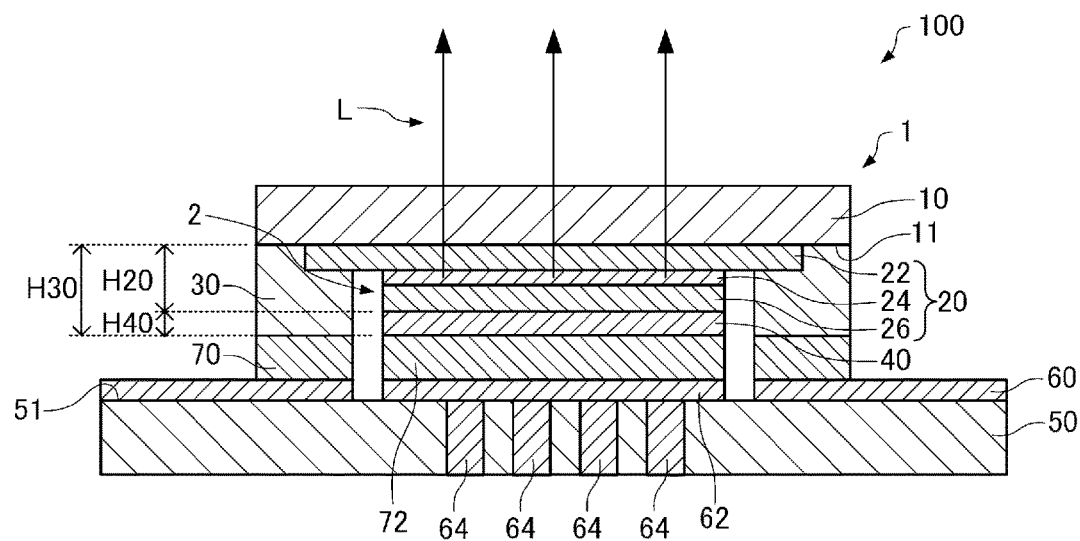
[Fig. 2]
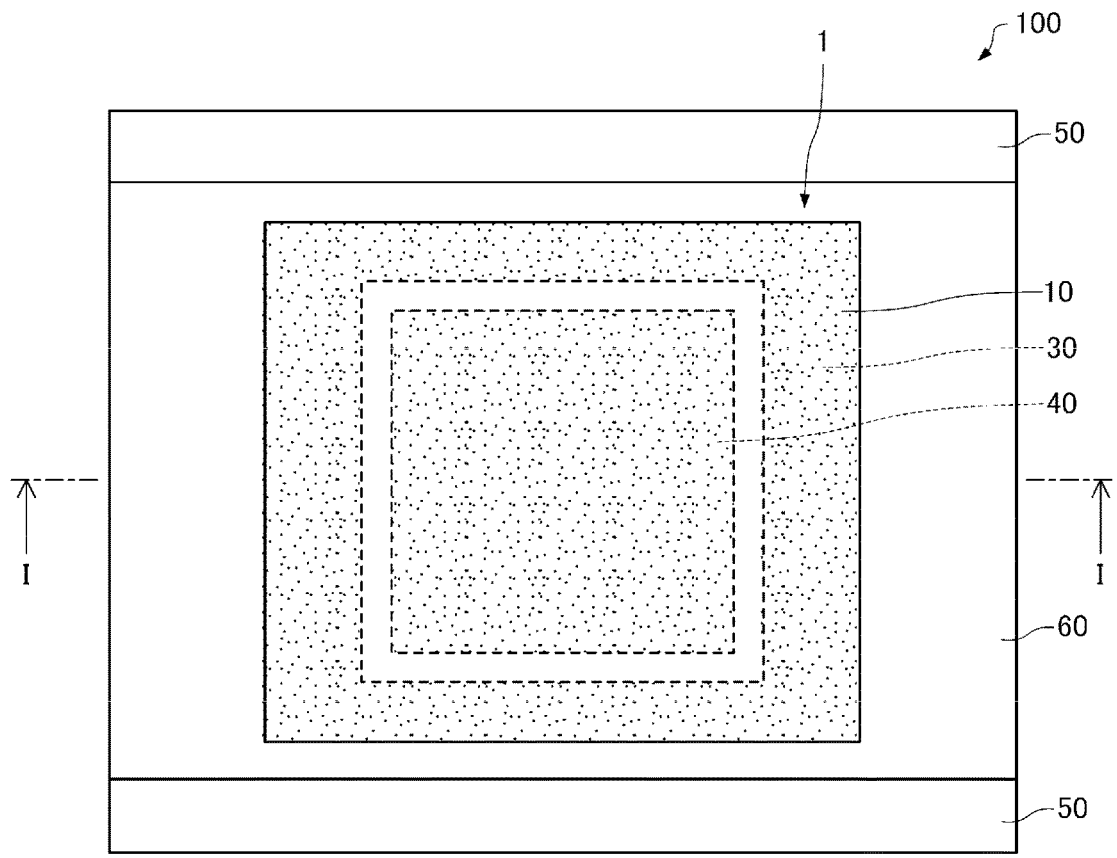

[Fig. 3]
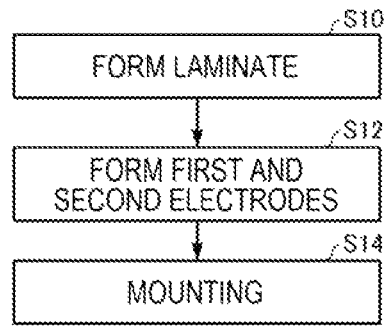
[Fig. 4]
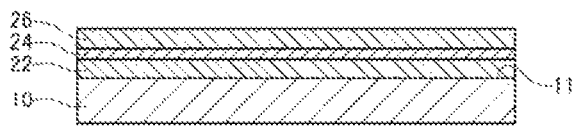
[Fig. 5]
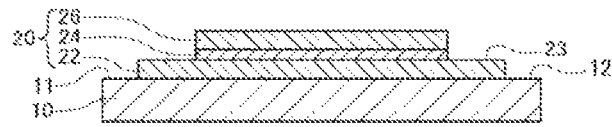
[Fig. 6]
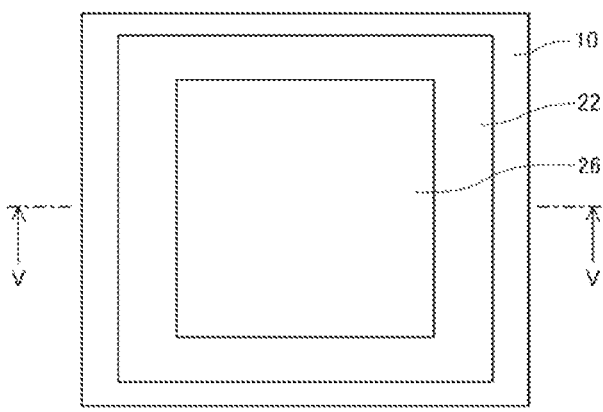
[Fig. 7]
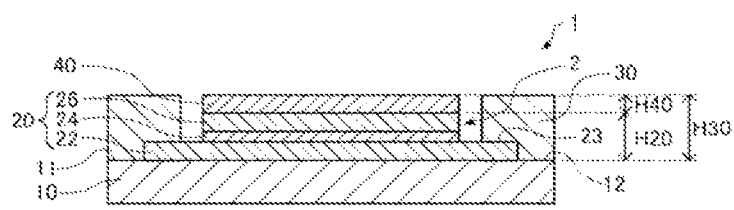

[Fig. 8]
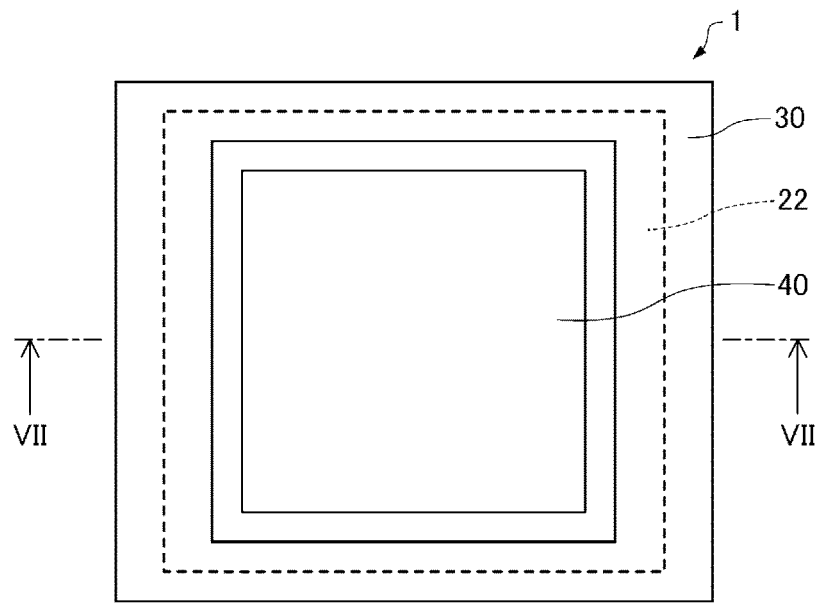
[Fig. 9]
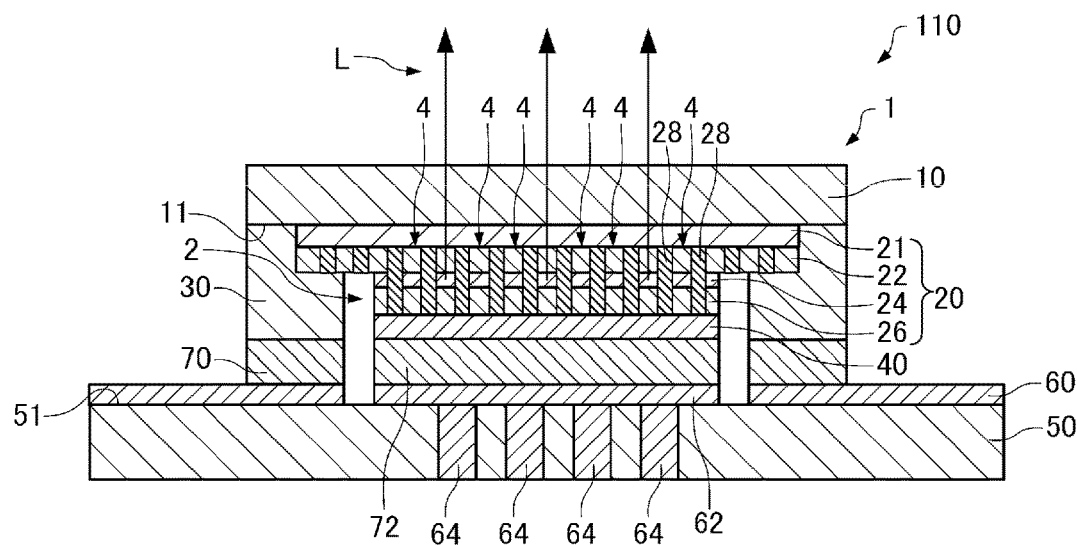
[Fig. 10]
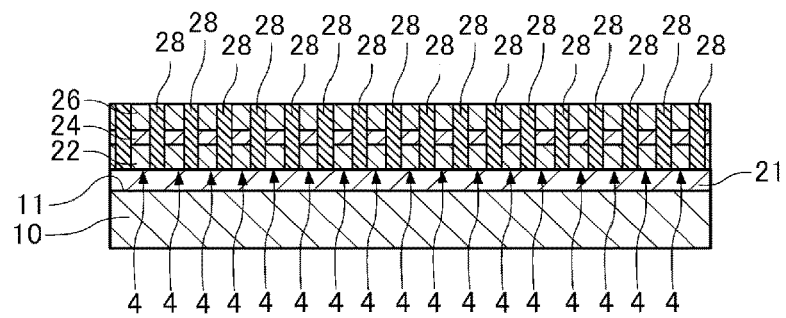

[Fig. 11]
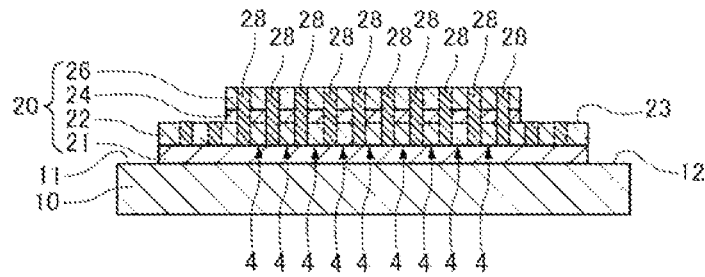
[Fig. 12]
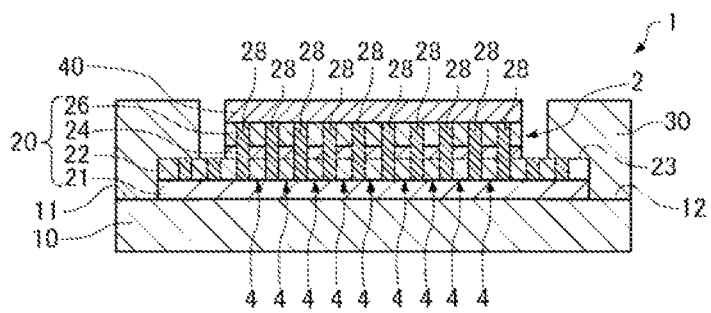
[Fig. 13]
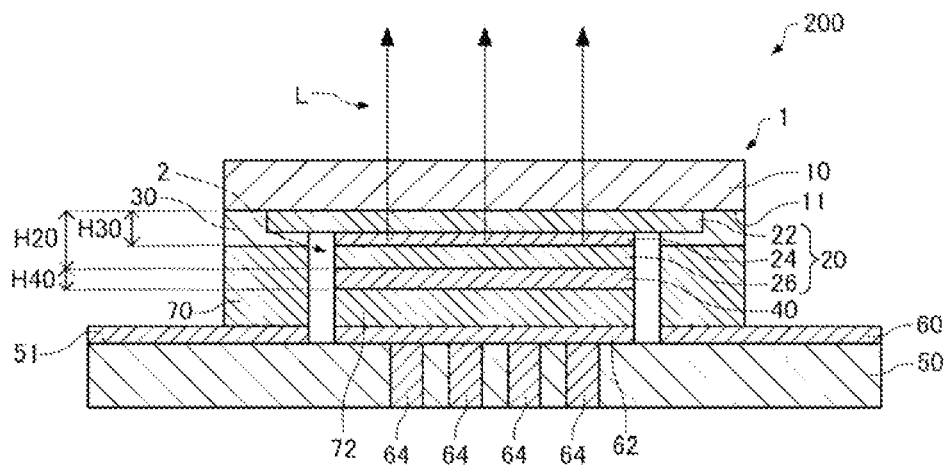
[Fig. 14]
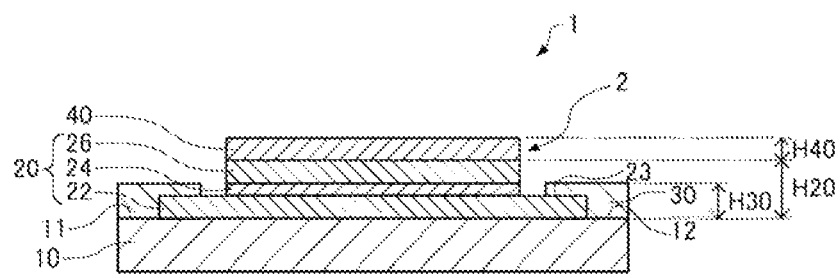

[Fig. 15]
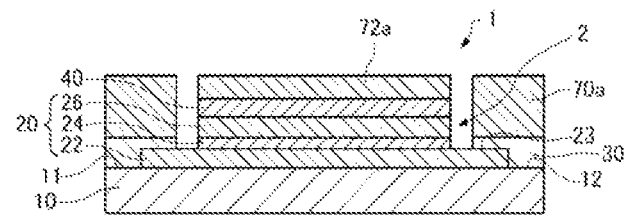
[Fig. 16]
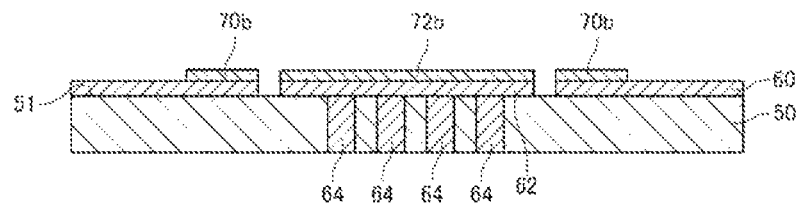
[Fig. 17]
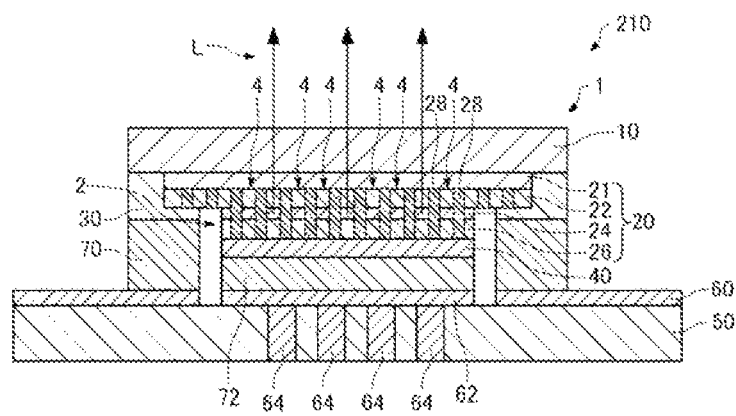
[Fig. 18]
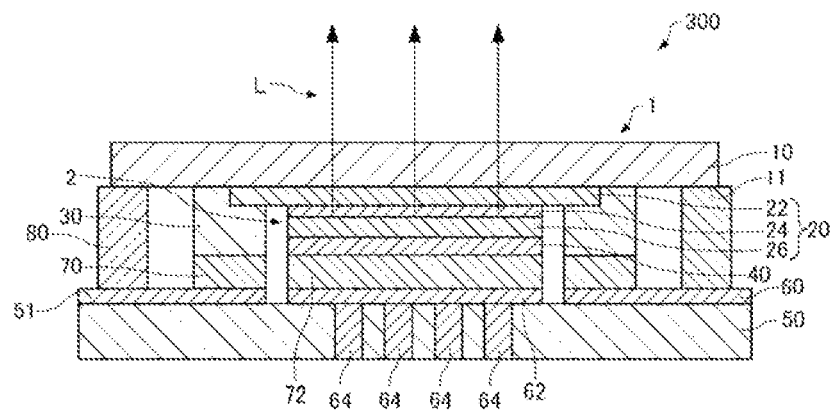

[Fig. 19]
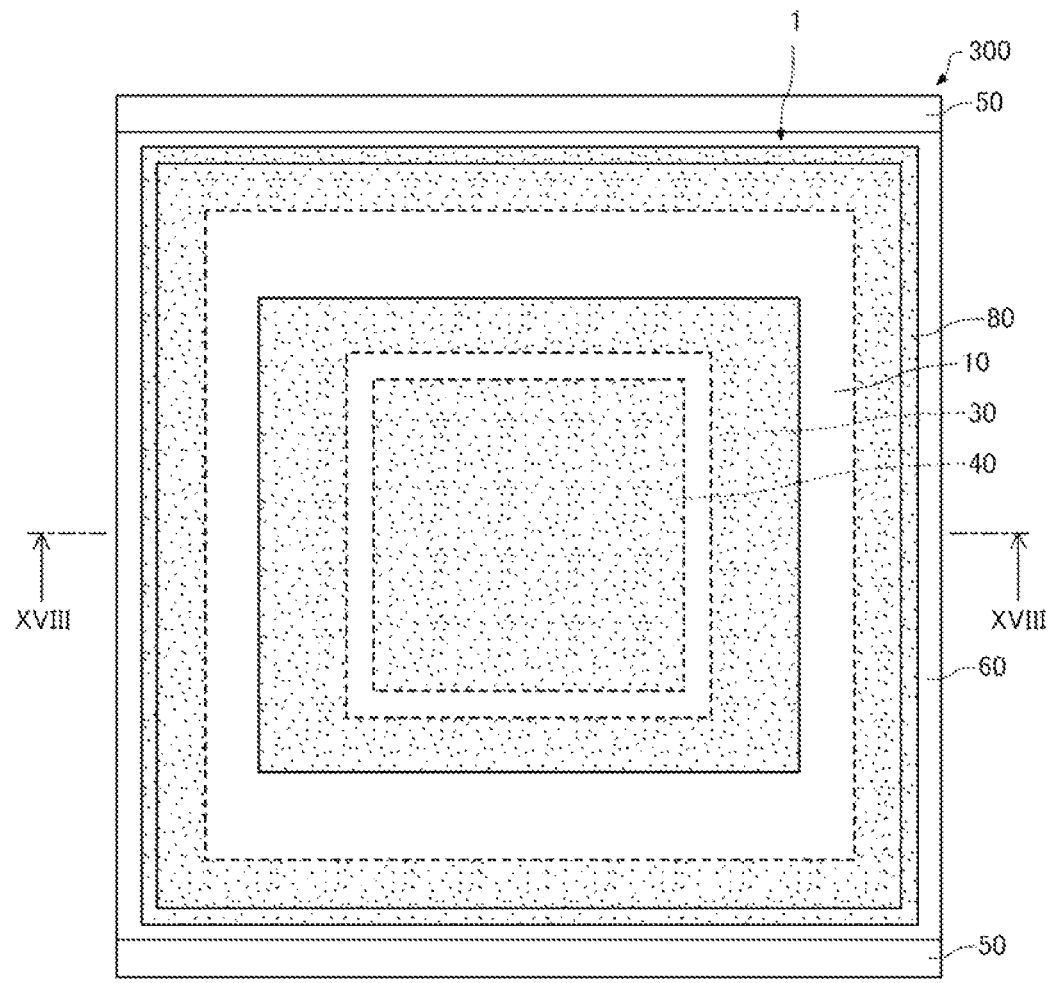
[Fig. 20]
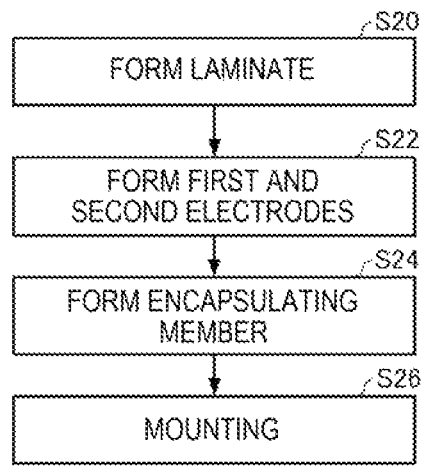

[Fig. 21]
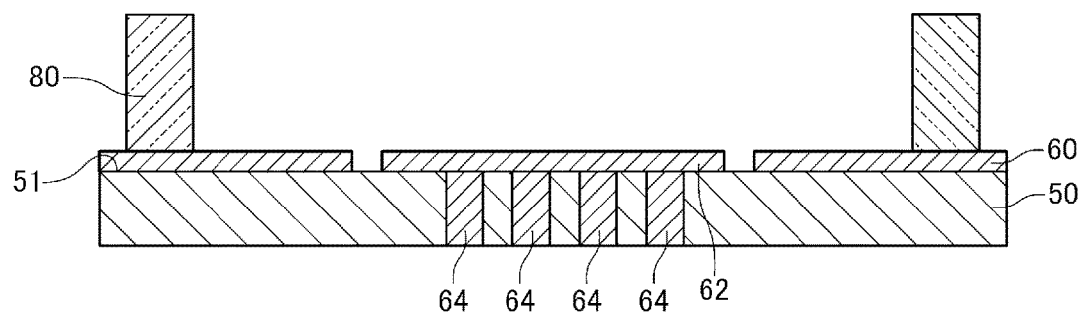
[Fig. 22]
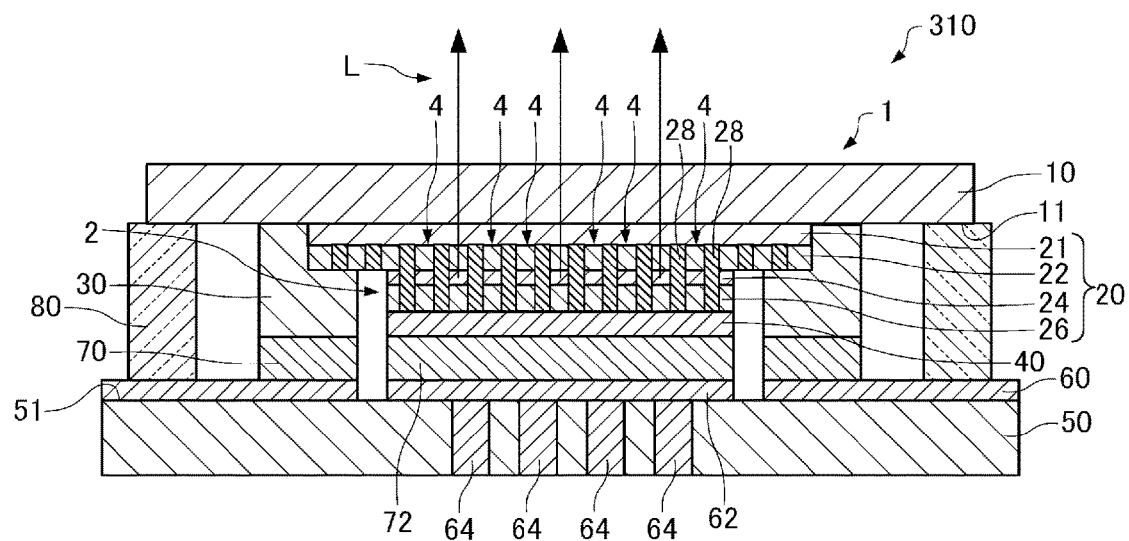
[Fig. 23]
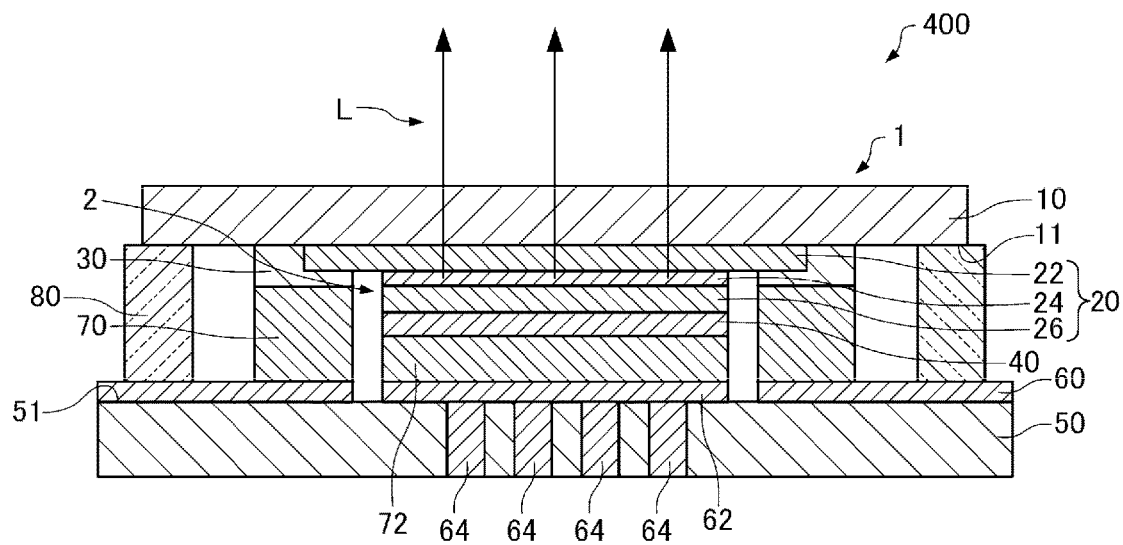

[Fig. 24]
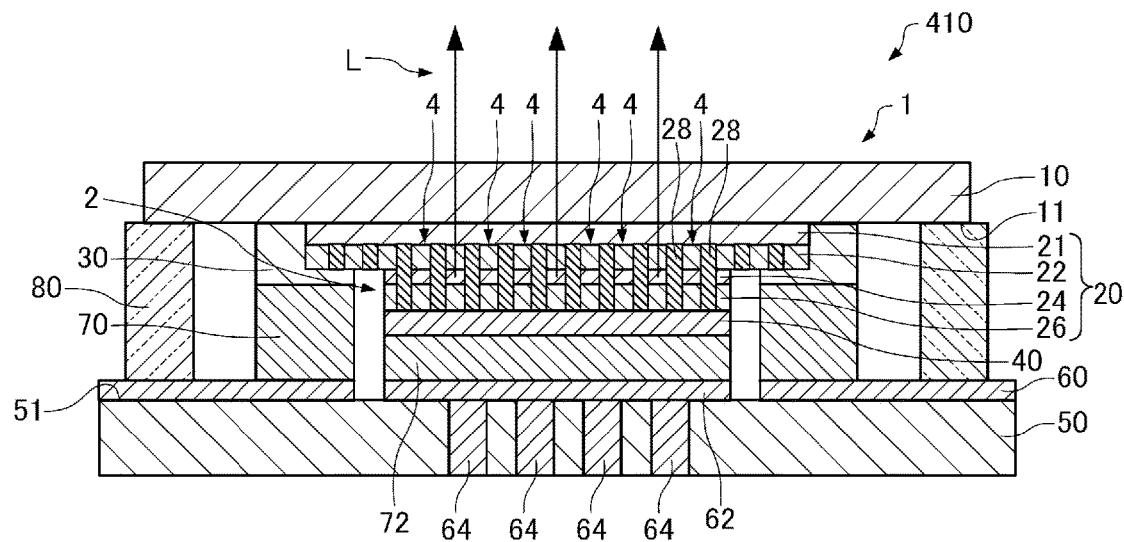
[Fig. 25]
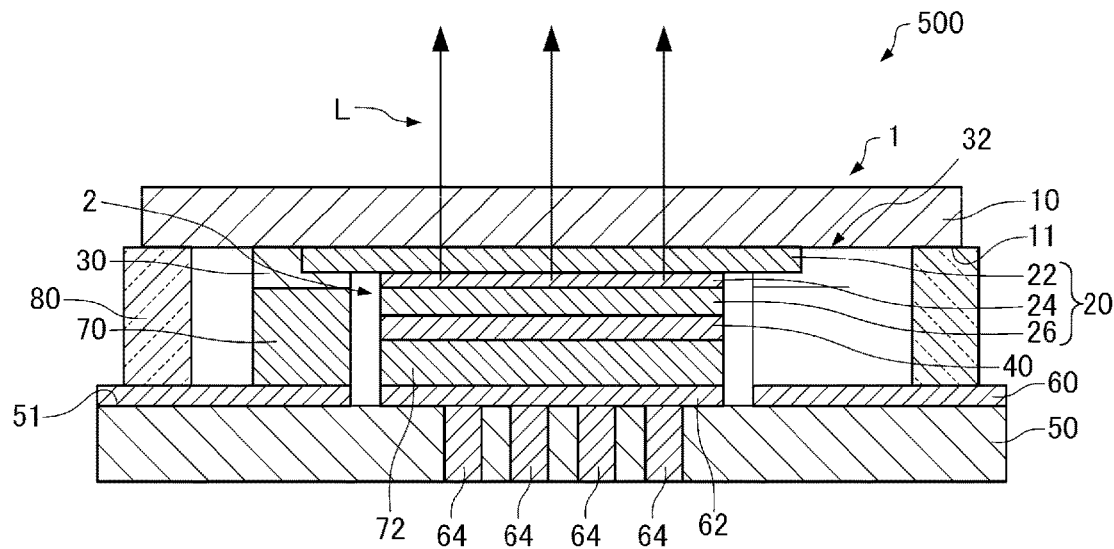

[Fig. 26]
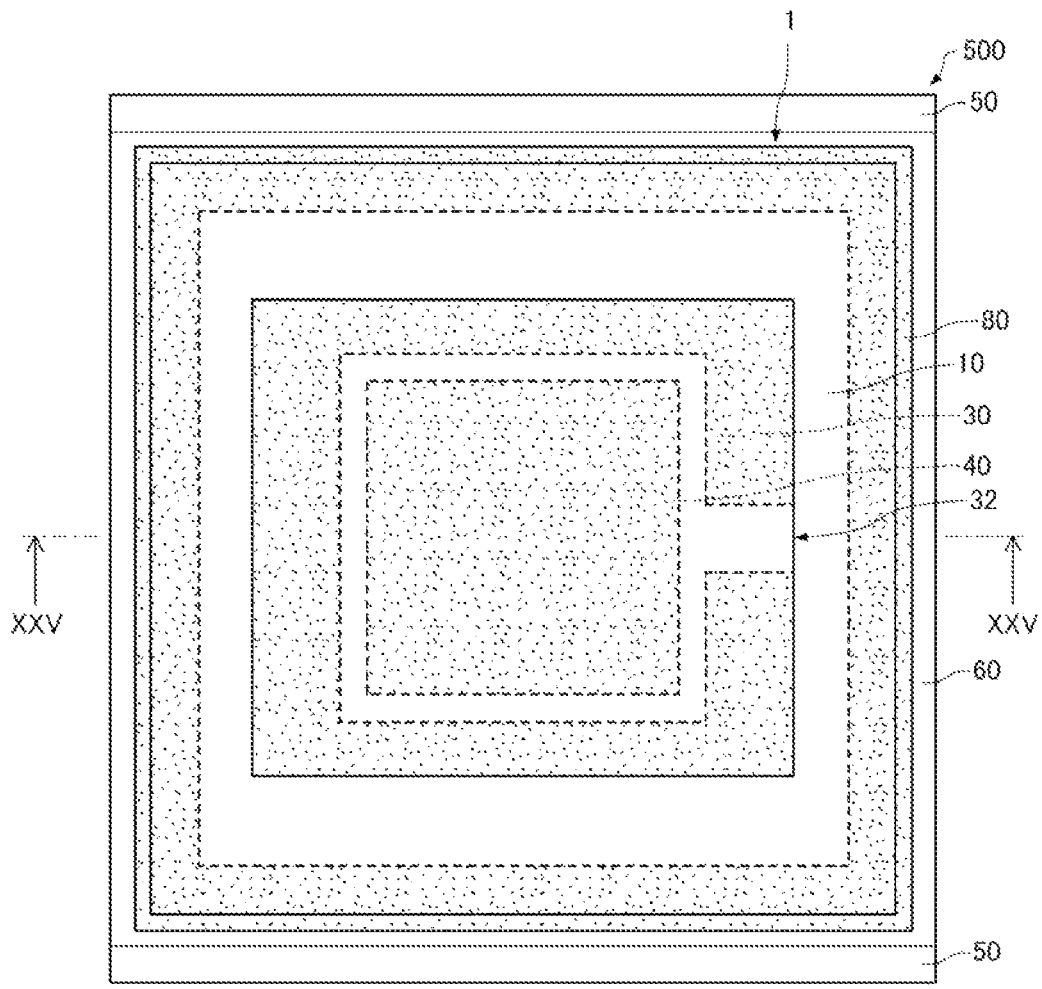
[Fig. 27]
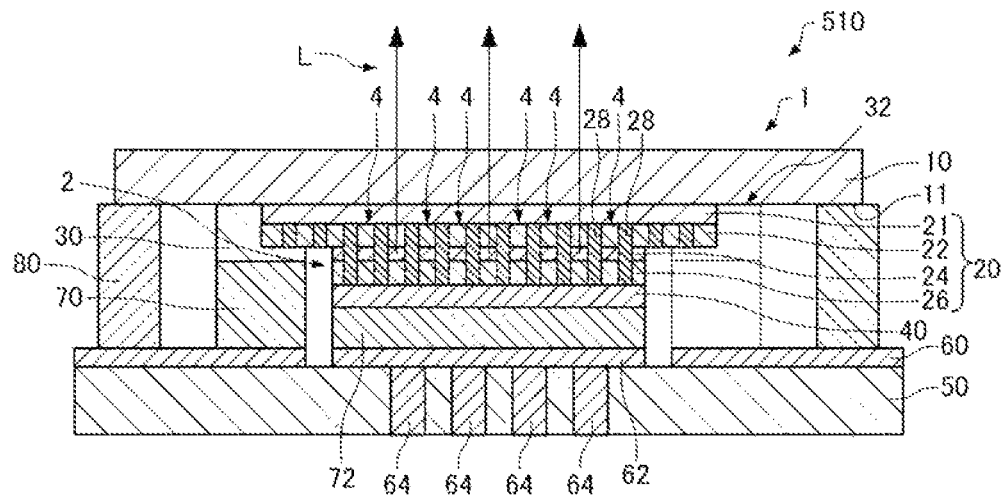

[Fig. 28]
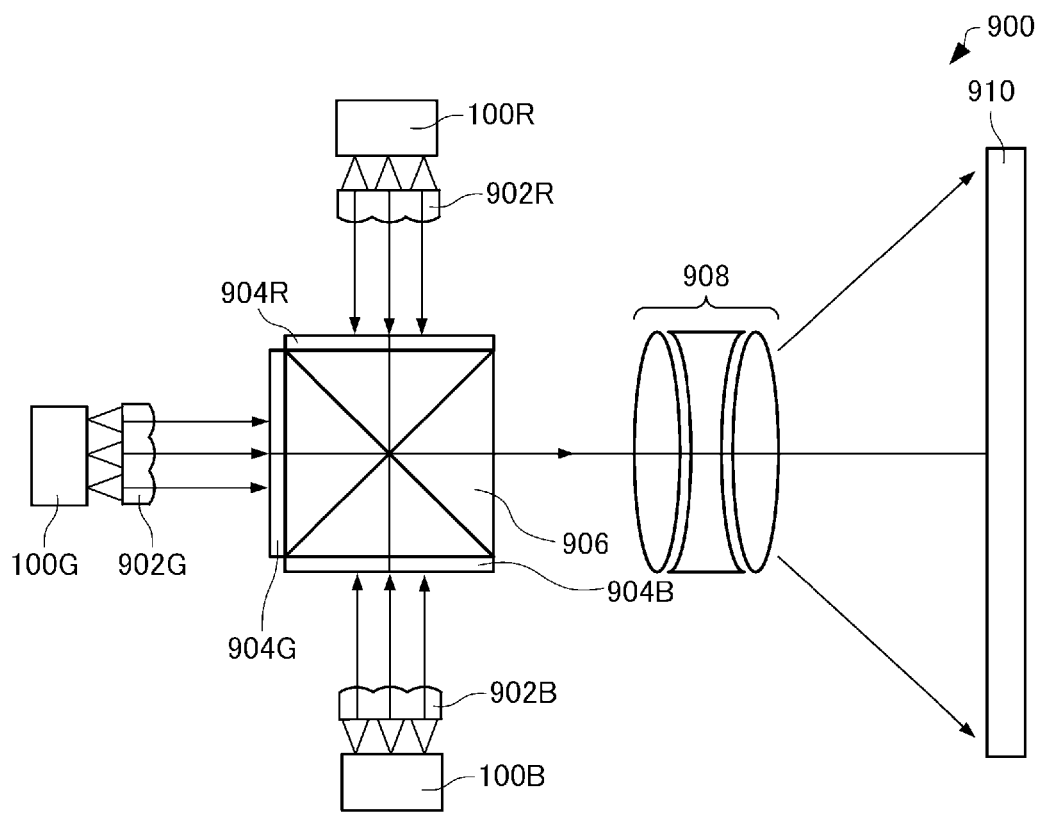

LIGHT EMITTING APPARATUS, PROJECTOR, METHOD FOR MANUFACTURING LIGHT EMITTING APPARATUS

CROSS REFERENCE TO RELATED APPLICATIONS

This application is a U.S. National Phase application of International Application No. PCT/JP2018/019841, filed on May 23, 2018 and published in Japanese as WO 2018/221317 A1 on Dec. 6, 2018, which is based on, and claims priority from JP Application Serial Number 2017-108346, filed on May 31, 2017. The disclosures of both of the above applications are hereby incorporated by reference herein in their entirety.

BACKGROUND

1. Technical Field

The present disclosure relates to a light emitting apparatus, a projector, and a method for manufacturing the light emitting apparatus.

2. Related Art

As a method for mounting a light emitting device, such as a semiconductor laser and a light emitting diode, junction-down mounting has been known. A junction-down-mounted light emitting device can efficiently dissipate heat generated in the light emitting device.

For example, JP-A-2000-261088 discloses a light emitting device in which a surface electrode of a laser chip is glued to a mount that serves as a heat sink with a solder material in junction-down mounting. The laser chip is formed of a substrate, an active layer formed on the substrate and including a lower cladding layer, a quantum well layer, and an upper cladding layer, the surface electrode formed on the active layer, and a rear electrode provided on the rear surface of the substrate.

In the light emitting device disclosed in JP-A-2000-261088, however, a large amount of pressure acts on the active layer when the surface electrode of the laser chip is bonded to the mount so that the light emitting device is mounted on the mount in a manufacturing step, undesirably resulting in stress and strain induced in the active layer (light emitter). As a result, a defect or translocation that occurs in the active layer may cause an unstable light emission characteristic and breakage of the active layer.

SUMMARY

An object according to some aspects of the disclosure is to provide a light emitting apparatus that allows pressure acting on a light emitter to lower when the light emitter is mounted. Another object according to some aspects of the disclosure is to provide a projector including the light emitting apparatus. Still another object according to some aspects of the disclosure is to provide a method for manufacturing the light emitting apparatus that allows pressure acting on a light emitter to lower when the light emitter is mounted.

A light emitting apparatus according to the disclosure includes a light emitting device including a first base at which a laminate is provided, a second base at which the light emitting device is provided, and a first member provided between the first base and the second base, the laminate includes a light emitter, the light emitter includes a first semiconductor layer, a second semiconductor layer of a conductivity type different from a conductivity type of the first semiconductor layer, and a light emitting layer provided between the first semiconductor layer and the second semiconductor layer and capable of emitting light when current is injected into the light emitting layer, the first member has one end connected to the first base and another end connected to the second base, and the laminate is connected to the second base on a side opposite the first base.

In the light emitting apparatus, which includes the first member having one end connected to the first base and another end connected to the second base, force applied when the laminate is mounted on the second base (that is, when light emitting device including laminate is mounted on second base) in a manufacturing step is distributed to the laminate and the first member. Therefore, in the thus configured light emitting apparatus, when the light emitting device is mounted, pressure acting on the light emitter (laminate) can be lowered. As a result, possibility of stress and strain induced in the light emitter (laminate) can be reduced, whereby a reliable light emitting apparatus having a stable light emission characteristic can be achieved.

In the light emitting apparatus according to the disclosure, the first member may be so provided as to surround a circumference of the laminate.

The thus configured light emitting apparatus can prevent the force acting when the light emitting device is mounted from concentrating on the laminate, whereby the pressure acting on the light emitter (laminate) at the time of the mounting can be lowered.

In the light emitting apparatus according to the disclosure, the laminate may be airtightly encapsulated by the first member, the first base, and the second base.

The thus configured light emitting apparatus allows reduction in size of the apparatus and simplification of the manufacturing steps as compared, for example, with a case where the light emitting device is airtightly encapsulated in a ceramic package, a CAN package, or any other package.

In the light emitting apparatus according to the disclosure, the first member may be electrically conductive and electrically connected to the first semiconductor layer.

In the thus configured light emitting apparatus, the first member is allowed to function also as an electrode via which current is injected into the first semiconductor layer.

The light emitting apparatus according to the disclosure may further include a second member provided between the first base and the second base, and the second member may have one end connected to the first base and another end connected to the second base.

In the thus configured light emitting apparatus, force applied when the light emitting device is mounted is distributed to the laminate, the first member, and the second member, whereby pressure acting on the light emitter (laminate) at the time of the mounting can be further lowered.

In the light emitting apparatus according to the disclosure, the second member may surround circumferences of the first member and the laminate.

The thus configured light emitting apparatus can prevent the force acting when the light emitting device is mounted from concentrating on the laminate, whereby the pressure acting on the light emitter (laminate) at the time of the mounting can be lowered.

In the light emitting apparatus according to the disclosure, the second base may be provided with a through electrode that passes through the second base.

The thus configured light emitting apparatus allows the laminate (light emitter) airtightly encapsulated by the first member, the first base, and the second base to be electrically connected to an external power source apparatus.

In the light emitting apparatus according to the disclosure, the second semiconductor layer may be electrically connected to the through electrode.

The thus configured light emitting apparatus allows the laminate (light emitter) airtightly encapsulated by the first member, the first base, and the second base to be electrically connected to an external power source apparatus.

In the light emitting apparatus according to the disclosure, the laminate may include a plurality of columnar sections, and the light emitter may be formed of the plurality of columnar sections.

The thus configured light emitting apparatus allows decrease in dislocation and defects that occur in the first semiconductor layer, the light emitting layer, and the second semiconductor layer, whereby a high-quality crystal can be provided. The thus configured light emitting apparatus can therefore have an excellent light emission characteristic.

In the light emitting apparatus according to the disclosure, the first member may be connected to the second base via a bonding member.

The thus configured light emitting apparatus allows the first member and the second base to be more reliably connected (bonded) to each other.

A projector according to the disclosure includes any of the light emitting apparatuses according to the disclosure.

The thus configured projector can include any of the light emitting apparatuses according to the disclosure.

A method for manufacturing a light emitting apparatus according to the disclosure includes the steps of:

forming a laminate including a light emitter at a first base,
forming a first member at the first base, and
coupling the laminate and the first member formed at the first base to a second base,
and the light emitter includes
a first semiconductor layer,
a second semiconductor layer of a conductivity type different from a conductivity type of the first semiconductor layer, and
a light emitting layer provided between the first semiconductor layer and the second semiconductor layer and capable of emitting light when current is injected into the light emitting layer.

In the method for manufacturing a light emitting apparatus, in the step of coupling the laminate and the first member to the second base (mounting step), force applied at the time of the mounting (when laminate is mounted on second base) is distributed to the laminate and the first member. Therefore, at the time of the mounting, pressure acting on the light emitter (laminate) can be lowered. As a result, possibility of stress and strain induced in the light emitter (laminate) can be reduced, whereby a reliable light emitting apparatus having a stable light emission characteristic can be achieved.

BRIEF DESCRIPTION OF THE DRAWINGS

FIG. 1 is a cross-sectional view diagrammatically showing a light emitting apparatus according to a first embodiment.

FIG. 2 is a plan view diagrammatically showing the light emitting apparatus according to the first embodiment.

FIG. 3 is a flowchart showing an example of a method for manufacturing the light emitting apparatus according to the first embodiment.

FIG. 4 diagrammatically shows one of the steps of manufacturing the light emitting apparatus according to the first embodiment.

FIG. 5 diagrammatically shows one of the steps of manufacturing the light emitting apparatus according to the first embodiment.

FIG. 6 diagrammatically shows one of the steps of manufacturing the light emitting apparatus according to the first embodiment.

FIG. 7 diagrammatically shows one of the steps of manufacturing the light emitting apparatus according to the first embodiment.

FIG. 8 diagrammatically shows one of the steps of manufacturing the light emitting apparatus according to the first embodiment.

FIG. 9 is a cross-sectional view diagrammatically showing a light emitting apparatus according to a variation of the first embodiment.

FIG. 10 is a cross-sectional view diagrammatically showing one of the steps of manufacturing the light emitting apparatus according to the variation of the first embodiment.

FIG. 11 is a cross-sectional view diagrammatically showing one of the steps of manufacturing the light emitting apparatus according to the variation of the first embodiment.

FIG. 12 is a cross-sectional view diagrammatically showing one of the steps of manufacturing the light emitting apparatus according to the variation of the first embodiment.

FIG. 13 is a cross-sectional view diagrammatically showing a light emitting apparatus according to a second embodiment.

FIG. 14 is a cross-sectional view diagrammatically showing one of the steps of manufacturing the light emitting apparatus according to the second embodiment.

FIG. 15 is a cross-sectional view diagrammatically showing one of the steps of manufacturing the light emitting apparatus according to the second embodiment.

FIG. 16 is a cross-sectional view diagrammatically showing one of the steps of manufacturing the light emitting apparatus according to the second embodiment.

FIG. 17 is a cross-sectional view diagrammatically showing a light emitting apparatus according to a variation of the second embodiment.

FIG. 18 is a cross-sectional view diagrammatically showing a light emitting apparatus according to a third embodiment.

FIG. 19 is a plan view diagrammatically showing the light emitting apparatus according to the third embodiment.

FIG. 20 is a flowchart showing an example of a method for manufacturing the light emitting apparatus according to the third embodiment.

FIG. 21 is a cross-sectional view diagrammatically showing one of the steps of manufacturing the light emitting apparatus according to the third embodiment.

FIG. 22 is a cross-sectional view diagrammatically showing a light emitting apparatus according to a variation of the third embodiment.

FIG. 23 is a cross-sectional view diagrammatically showing a light emitting apparatus according to a fourth embodiment.

FIG. 24 is a cross-sectional view diagrammatically showing a light emitting apparatus according to a variation of the fourth embodiment.

FIG. 25 is a cross-sectional view diagrammatically showing a light emitting apparatus according to a fifth embodiment.

FIG. 26 is a plan view diagrammatically showing the light emitting apparatus according to the fifth embodiment.

FIG. 27 is a cross-sectional view diagrammatically showing a light emitting apparatus according to a variation of the fifth embodiment.

FIG. 28 diagrammatically shows a projector according to a sixth embodiment.

DESCRIPTION OF EXEMPLARY EMBODIMENTS

Preferable embodiments of the disclosure will be described below in detail with reference to the drawings. It is not intended that the embodiments described below unduly limit the contents of the disclosure set forth in the claims. All configurations described below are not necessarily essential configuration requirements of the disclosure.

1. First Embodiment 1.1. Light Emitting Apparatus

A light emitting apparatus according to a first embodiment will first be described with reference to the drawings. FIG. 1 is a cross-sectional view diagrammatically showing a light emitting apparatus 100 according to the first embodiment. FIG. 2 is a plan view diagrammatically showing the light emitting apparatus 100 according to the first embodiment. FIG. 1 is the cross-sectional view taken along the line I-I in FIG. 2.

The light emitting apparatus 100 includes a light emitting device 1 and a second base 50, and the light emitting device 1 includes a first base 10, a laminate 20, a first electrode 30 (first member), and a second electrode 40, as shown in FIG. 1.

In the light emitting apparatus 100, the first base 10, the laminate 20, the first electrode 30, and the second electrode 40 form the light emitting device 1, and the light emitting device 1 is mounted on the second base 50 (mounting substrate) in junction-down mounting.

The first base 10 has, for example, a plate-like shape. The first base 10 is, for example, a sapphire substrate. The first base 10 is transparent to light L produced in a light emitting layer 24. The light L produced in the light emitting layer 24 therefore passes through the first base 10 and exits outside. That is, the light emitting apparatus 100 outputs the light L from the side facing the first base 10. The first base 10 is not limited to a sapphire substrate and can, for example, be another ceramic substrate or a glass substrate.

The laminate 20 is provided on the first base 10. The laminate 20 is provided on a principal surface 11 of the first base 10. The laminate 20 is located between the first base 10 and the second base 50. The laminate 20 is formed of a plurality of layers layered on the principal surface 11 of the first base 10. The laminate 20 includes a light emitter 2. The light emitter 2 includes a first semiconductor layer 22, the light emitting layer 24, and a second semiconductor layer 26.

In the light emitting apparatus 100, the light emitting device 1 is mounted on the second base 50 in junction-down mounting, as described above. That is, in the light emitting apparatus 100, the laminate 20 is connected to the second base 50 on the side opposite the first base 10. The laminate 20 is connected to the second base 50 (second wiring 62) via the second electrode 40 and a bonding member 72.

In the description according to the disclosure, in a case where the term "couple" is used, for example, as follows: "a specific object (hereinafter referred to as "A") is connected to another specific object (hereinafter referred to as "B")," the situation expressed by the term "couple" includes both a case where A is directly connected to B (A is in contact with B) and a case where A is connected to B via another object. Further, in the description according to the disclosure, in a case where the term "provide" is used, for example, as follows: "a specific object (hereinafter referred to as "C") is provided at another specific object (hereinafter referred to as "D")," the situation expressed by the term "provide" includes both a case where C is directly provided at D (C is in contact with D) and a case where C is provided at D via another object.

The first semiconductor layer 22 is provided at the first base 10. The first semiconductor layer 22 is provided between the first base 10 and the light emitting layer 24. The first semiconductor layer 22 is, for example, a GaN layer of a first conductivity type (n type, for example) (specifically, GaN layer to which Si is doped). Although not shown, a buffer layer may be provided between the first semiconductor layer 22 and the first base 10. The buffer layer is, for example, an undoped GaN layer.

The light emitting layer 24 is provided between the first semiconductor layer 22 and the second semiconductor layer 26. The light emitting layer 24 is a layer capable of emitting light when current is injected thereinto. The light emitting layer 24 has a quantum well structure formed, for example, of a GaN layer and an InGaN layer. The number of GaN and InGaN layers that form the light emitting layer 24 is not limited to a specific number.

The second semiconductor layer 26 is provided between the light emitting layer 24 and the second electrode 40. The second semiconductor layer 26 is a layer of a conductivity type different from the conductivity type of the first semiconductor layer 22. The second semiconductor layer 26 is, for example, a GaN layer of a second conductivity type (p type, for example) (specifically, GaN layer to which Mg is doped).

In the light emitting device 1, the p-type second semiconductor layer 26, the no-impurity-doped light emitting layer 24, and the n-type first semiconductor layer 22 form a pin diode. The first semiconductor layer 22 and the second semiconductor layer 26 are each a layer having a bandgap wider than that of the light emitting layer 24. In the light emitting device 1, application of forward bias voltage associated with the pin diode to the space between the first electrode 30 and the second electrode 40 (injection of current to space) causes recombination of electrons and holes in the light emitting layer 24. The recombination causes light emission. The light L produced in the light emitting layer 24 passes through the first base 10 and exits in the lamination direction of the laminate 20 (hereinafter also simply referred to as "lamination direction"). The light emitting device 1 is therefore a light emitting diode (LED).

The first electrode 30 is provided between the first base 10 and the second base 50. The first electrode 30 has one end connected to the first base 10 and another end connected to the second base 50. Specifically, the first electrode 30 and the first base 10 are connected to each other by removal of the first semiconductor layer 22 provided at the first base 10 and direct formation of the first electrode 30 at the first base 10. The one end of the first electrode 30 is further connected to the first semiconductor layer 22. The first electrode 30 and the second base 50 are bonded to each other via a bonding member 70. In the example shown in FIG. 1, the first electrode 30 and the second base 50 are connected to each other by bonding the first electrode 30 to first wiring 60 provided on the second base 50 via the bonding member 70.

The first electrode 30 is electrically connected to the first semiconductor layer 22. The first electrode 30 is further electrically connected to the first wiring 60. The first electrode 30 is one electrode via which current is injected into the light emitting layer 24. The first electrode 30 is, for example, a metal layer, such as an Au layer and an Ag layer, or a laminate of a Cr layer, an Ni layer, and an Au layer laminated in the presented order from the side facing the first base 10 and the first semiconductor layer 22.

The first electrode 30 surrounds the laminate 20 in the plan view (when viewed along lamination direction), as shown in FIG. 2. The first electrode 30 is provided along the outer edge of the laminate 20 in the plan view. In the plan view, part of the first electrode 30 overlaps with an outer edge portion of the first semiconductor layer 22. In the example shown in FIG. 2, the first electrode 30 has a quadrangular tubular shape.

In the light emitting apparatus 100, the first electrode 30, which surrounds the circumference of the laminate 20, the first base 10, which is connected to one end of the first electrode 30, and the second base 50, which is connected to the other end of the first electrode 30, form a space that airtightly accommodates the laminate 20. That is, the laminate 20 is airtightly encapsulated by the first electrode 30, the first base 10, and the second base 50. The space in which the laminate 20 is accommodated has, for example, an inert gas atmosphere.

The second electrode 40 is provided on the side of the laminate 20 that is the side opposite the first base 10. The second electrode 40 is provided between the laminate 20 and the second wiring 62 (second base 50). The second electrode 40 is electrically connected to the second semiconductor layer 26. The second electrode 40 is further electrically connected to the second wiring 62. The second semiconductor layer 26 is therefore electrically connected to through electrodes 64 via the second electrode 40 and the second wring 62. The second electrode 40 is the other electrode via which current is injected into the light emitting layer 24. The second electrode 40 is, for example, a metal layer, such as an Au layer and an Ag layer, or a laminate of a Pd layer, an Pt layer, and an Au layer laminated in the presented order from the side facing the second semiconductor layer 26. The first electrode 30 and the second electrode 40 may be made of the same material or different materials.

Although not shown, a contact layer may be provided between the second electrode 40 and the second semiconductor layer 26. The contact layer may be in ohmic contact with the second electrode 40. The contact layer is, for example, a p-type GaN layer.

A height H30 of the first electrode 30 is equal to the sum of a height H20 of the laminate 20 and a height H40 of the second electrode 40 (H20+H40). The height refers to the size in the lamination direction. That is, the distance between the principal surface 11 of the first base 10 and a surface of the first electrode 30 that is the surface facing the second base 50 is equal to the distance between the principal surface 11 of the first base 10 and a surface of the second electrode 40 that is the surface facing the second base 50. Therefore, when the light emitting device 1 is mounted on the second base 50, the first electrode 30 and the second base 50 (first wiring 60) can be reliably connected to each other, so can the second electrode 40 and the second base 50 (second wiring 62).

Although not shown, the height H30 of the first electrode 30 may differ from the sum of the height H20 of the laminate 20 and the height H40 of the second electrode 40 (H20+ H40).

The second base 50 has, for example, a plate-like shape. The second base 50 is a mounting substrate on which the light emitting device 1 is mounted. The first wiring 60, which is electrically connected to the first electrode 30, and the second wiring 62, which is electrically connected to the second electrode 40, are provided on a principal surface 51 of the second base 50 (surface on which light emitting device 1 is mounted). The through electrodes 64, which pass through the second base 50, are provided in the second base 50. The through electrodes 64 are electrically connected to the second electrode 40 via the second wiring 62.

The second base 50 is, for example, a semiconductor substrate, such as an SiC substrate, or a ceramic substrate, such as an AlN substrate. A semiconductor material, such as SiC, and a ceramic material, such as AlN, each have high thermal conductivity and high electrical insulation. Using any of the substrates described above as the second base 50 can therefore enhance dissipation of heat from the light emitter 2 and readily allows insulation of the first wiring 60, the second wiring 62, and the through electrodes 64. The second base 50 may instead be a metal substrate, such as a CuW substrate and a CuMo substrate. In this case, to form the first wiring 60, the second wiring 62, and the through electrodes 64, an insulating layer or any other layer needs to be provided between the second base 50 and the wiring 60, the second base 50 and the wiring 62, and the second base 50 and the through electrodes 64.

The coefficient of thermal expansion of the second base 50 is preferably close to the coefficient of thermal expansion of the first base 10. Warpage of the first base 10, which occurs due to heat used when the light emitting device 1 is mounted on the second base 50 and heat generated when the light emitting device 1 is driven, can thus be reduced, whereby stress induced in the light emitter 2 can be reduced. Further, the thermal conductivity of the second base 50 is preferably higher, for example, than the thermal conductivity of the laminate 20 and more preferably higher than the terminal conductivity of the first base 10. The thermal capacity of the second base 50 is preferably greater than the thermal capacity of the first base 10. The dissipation of heat from the light emitter 2 (laminate 20) can thus be enhanced.

A method for measuring the thermal conductivity of the first base 10, the laminate 20, and the second base 50 is not limited to a specific method. The thermal conductivity of the first base 10, the laminate 20, and the second base 50 may be determined, for example, by a steady state method or may be determined from specific heat capacity or thermal diffusivity obtained by a non-steady-state method, such as a flash method. In a case where a target under measurement is, for example, a ceramic substrate, the thermal conductivity may be measured in accordance with JIS R1611.

The first wiring 60 is provided on the principal surface 51 of the second base 50. The first wiring 60 is provided in an area where the first wiring 60 overlaps with the first electrode 30 in the plan view. The first wiring 60 is wiring for electrically coupling the first electrode 30 to an external power source apparatus (not shown).

The second wiring 62 is provided on the principal surface 51 of the second base 50. The second wiring 62 is provided in an area where the second wiring 62 overlaps with the second electrode 40 in the plan view. The second wiring 62 is electrically connected to the through electrodes 64.

The through electrodes 64 pass through the second base 50. The through electrode 64 are provided in an area where the through electrodes 64 overlap with the second wiring 62 in the plan view. In the example shown in FIG. 1, the through electrodes 64 are provided at a plurality of locations. The number of through electrodes 64 is not limited to a specific number. The second wiring 62 and the through electrodes 64 form wiring for electrically coupling the second electrode 40 to the external power source apparatus. The through electrodes 64 can provide the airtightly encapsulated laminate 20 (light emitter 2) with electric power.

The bonding member 70 electrically and mechanically couples the first electrode 30 and the first wiring 60 to each other. Further, the bonding member 70 couples the first electrode 30 and the first wiring 60 to each other in such a way that the airtightness of the space that accommodates the laminate 20 is ensured. The bonding member 72 electrically and mechanically couples the second electrode 40 and the second wiring 62 to each other. The bonding members 70 and 72 are each, for example, Au-based solder, such as AuSn.

The light emitting apparatus 100 has, for example, the following features.

In the light emitting apparatus 100, the laminate 20 including the light emitter 2 is connected to the second base 50 on the side opposite the first base 10. That is, in the light emitting apparatus 100, the light emitting device 1 is mounted on the second base 50 in junction-down mounting. The light emitter 2 can thus dissipate heat in an improved manner. Further, the configuration in which the first electrode 30 is connected to the second base 50 allows the light emitting device 1 to dissipate heat in an improved manner.

Further, in the light emitting apparatus 100, the first electrode 30 has one end connected to the first base 10 and another end connected to the second base 50. Therefore, in the light emitting apparatus 100, force applied when the light emitting device 1 is mounted on the second base 50 in a manufacturing step is distributed to the laminate 20 and the first electrode 30. Therefore, when the light emitting device 1 is mounted, pressure acting on the laminate 20 (light emitter 2) can be lowered. As a result, the possibility of stress and strain induced in the light emitter 2 (laminate 20) can be reduced, whereby a reliable light emitting apparatus having a stable light emission characteristic can be achieved.

In the light emitting apparatus 100, the first electrode 30, which is electrically connected to the first semiconductor layer 22 and is electrically conductive, functions as a member (first member) for lowering the pressure acting on the light emitter 2 when the light emitting device 1 is mounted. Therefore, in the light emitting apparatus 100, the pressure acting on the light emitter 2 at the time of the mounting can be lowered with no increase in the number of parts.

In the light emitting apparatus 100, the first electrode 30 is so provided as to surround the circumference of the laminate 20. The light emitting apparatus 100 can therefore prevent the force acting when the light emitting device 1 is mounted from concentrating on the laminate 20, whereby the pressure acting on the light emitter 2 at the time of the mounting can be lowered. For example, in a case where the first electrode 30 does not surround the circumference of the laminate 20, there is a possibility of concentration of the force acting at the time of the mounting on the laminate 20 by a greater amount than on the first electrode 30. In contrast, in the light emitting apparatus 100, the configuration in which the first electrode 30 surrounds the circumference of the laminate 20 can prevent the force acting at the time of the mounting from concentrating on the laminate 20.

In the light emitting apparatus 100, the first electrode 30, the first base 10, and the second base 50 airtightly encapsulate the laminate 20. The light emitting apparatus 100 therefore allows reduction in size of the apparatus and simplification of the manufacturing steps, whereby the cost can be lowered.

For example, in a case where the light emitting device 1 is encapsulated, for example, with a resin, sufficient airtightness cannot be ensured. Further, a configuration in which the light emitting device 1 is accommodated in a ceramic package with a glass lid, a CAN package, or any other package allows the airtightness to be ensured but causes an increase in the size of the apparatus, an increase in cost, and other problems. In contrast, the light emitting apparatus 100, in which the first electrode 30 is so provided as to surround the circumference of the laminate 20, allows airtight encapsulation of the laminate 20, whereby the size of the apparatus can be reduced, and the manufacturing steps can be simplified.

In the light emitting apparatus 100, the second base 50 is provided with the through electrodes 64. The second semiconductor layer 26 is electrically connected to the through electrodes 64. The light emitting apparatus 100 therefore allows the second semiconductor layer 26 airtightly encapsulated by the first electrode 30, the first base 10, and the second base 50 to be electrically connected to an external power source apparatus (not shown).

In the light emitting apparatus 100, the first electrode 30 is connected to the second base 50 via the bonding member 70. The light emitting apparatus 100 therefore allows the first electrode 30 and the second base 50 to be more reliably connected to each other.

1.2. Method for Manufacturing Light Emitting Apparatus

A method for manufacturing the light emitting apparatus 100 according to the first embodiment will next be described with reference to the drawings. FIG. 3 is a flowchart showing an example of the method for manufacturing the light emitting apparatus 100 according to the first embodiment. FIGS. 4 to 8 diagrammatically show the steps of manufacturing the light emitting apparatus 100 according to the first embodiment. FIG. 5 is a cross-sectional view taken along the line V-V in FIG. 6, and FIG. 7 is a cross-sectional view taken along the line VII-VII in FIG. 8.

(1) Formation of Laminate (S10)

The laminate 20 including the light emitter 2 is formed on the principal surface 11 of the first base 10.

In the present step, the first semiconductor layer 22, the light emitting layer 24, and the second semiconductor layer 26 are first epitaxially grown in the presented order on the principal surface 11 of the first base 10, as shown in FIG. 4. Examples of the method for performing the epitaxial growth may include metal organic chemical vapor deposition (MOCVD) and molecular beam epitaxy (MBE).

Instead, after a buffer layer (not shown) is formed on the principal surface 11 of the first base 10, the first semiconductor layer 22, the light emitting layer 24, and the second semiconductor layer 26 may be epitaxially grown in the presented order on the buffer layer.

The second semiconductor layer 26, the light emitting layer 24, and the first semiconductor layer 22 are patterned, as shown in FIGS. 5 and 6. The layers described above are patterned, for example, by photolithography and etching. In this process, an area 12, where the first base 10 is exposed, is so formed on the principal surface 11 of the first base 10 as to surround the circumference of the laminate 20 in the plan view. Similarly, an area 23, where the first semiconductor layer 22 is exposed, is so formed on the first semiconductor layer 22 as to surround the light emitting layer 24 and the second semiconductor layer 26 in the plan view. The laminate 20 can be formed by carrying out the step described above.

(2) Formation of First and Second Electrodes (S12)

The first electrode 30 is formed on the first base 10 (area 12) and on the first semiconductor layer 22 (area 23), and the second electrode 40 is formed on the laminate 20 (on second semiconductor layer 26), as shown in FIGS. 7 and 8.

The first electrode 30 and the second electrode 40 are formed, for example, by using a vacuum evaporation method or a liftoff method. The first electrode 30 is so formed as to surround the circumference of the laminate 20 in the plan view.

In the present step, the first electrode 30 and the second electrode 40 are so formed that the height H30 of the first electrode 30 is equal to the sum of the height H20 of the laminate 20 and the height H40 of the second electrode 40 (H20+H40). Therefore, the first electrode 30 and the second base 50 (first wiring 60) can be reliably connected to each other, and so are the second electrode 40 and the second base 50 (second wiring 62) in a mounting step (S14), which will be described later. The light emitting device 1 can be formed by carrying out the step described above. The first electrode 30 and the second electrode 40 are not necessarily formed in a specific order.

(3) Mounting (S14)

The laminate 20 (second electrode 40) and the first electrode 30 formed on the first base 10 are connected to the second base 50 to mount the light emitting device 1 on the second base 50, as shown in FIGS. 1 and 2.

In the present step, the mounting is so performed that a surface of the laminate 20 that is the surface opposite the first base 10 is connected to the second base 50 (junction-down mounting).

Specifically, the first electrode 30 is connected to the first wiring 60 via the bonding member 70, and the second electrode 40 is connected to the second wiring 62 via the bonding member 72. It is noted that the first wiring 60, the second wiring 62, and the through electrodes 64 are formed in advance in the second base 50.

The bonding members 70 and 72 are each solder, and the first electrode 30 and the first wiring 60 are bonded to each other with solder, and so are the second electrode 40 and the second wiring 62. For example, after the bonding member 70 and the bonding member 72 are formed on the first wiring 60 and the second wiring 62, respectively, for example, in a sputtering process, the light emitting device 1 is heated with the light emitting device 1 so disposed on the second base 50 that the first electrode 30 is in contact with the bonding member 70 and the second electrode 40 is in contact with the bonding member 72. As a result, the first electrode 30 is connected (bonded) to the first wiring 60, and the second electrode 40 is connected (bonded) to the second wiring 62. Performing the bonding in an inert gas atmosphere allows the space that accommodates the laminate 20 to have the inert gas atmosphere.

When the light emitting device 1 is mounted on the second base 50, the laminate 20 formed on the first base 10 is pressed against the second base 50, so that pressure acts on the laminate 20. In the present embodiment, in which the first electrode 30 is formed in addition to the laminate 20 on the first base 10, the force acting at the time of the mounting is distributed to the laminate 20 and the first electrode 30, whereby the pressure acting on the laminate 20 (light emitter 2) can be lowered.

The present step allows the light emitting device 1 to be mounted on the second base 50 and the laminate 20 to be airtightly encapsulated by the first electrode 30, the first base 10, and the second base 50.

The light emitting apparatus 100 can be manufactured by carrying out the steps described above.

The method for manufacturing the light emitting apparatus 100 according to the present embodiment has, for example, the following features.

The method for manufacturing the light emitting apparatus 100 according to the present embodiment includes the steps of forming the laminate 20 including the light emitter 2 on the first base 10, forming the first electrode 30 on the first base 10, and coupling the laminate 20 and the first electrode 30 formed on the first base 10 to the second base 50 (mounting step). The pressure acting on the laminate 20 (light emitter 2) can therefore be lowered in the mounting step, as described above. As a result, the possibility of stress and strain induced in the light emitter 2 (laminate 20) can be reduced, whereby a reliable light emitting apparatus having a stable light emission characteristic can be manufactured.

In the method for manufacturing the light emitting apparatus 100 according to the present embodiment, the first electrode 30 is so formed as to surround the circumference of the laminate 20. The first electrode 30, the first base 10, and the second base 50 can therefore airtightly encapsulate the laminate 20 in the mounting step. The steps of manufacturing the light emitting apparatus 100 can therefore be simplified as compared with a case where the light emitting device 1 is airtightly encapsulated in a ceramic package, a CAN package, or any other package.

1.3. Variation of Light Emitting Apparatus 1.3.1. Light Emitting Apparatus

A light emitting apparatus according to a variation of the first embodiment will next be described with reference to the drawings. FIG. 9 is a cross-sectional view diagrammatically showing a light emitting apparatus 110 according to the variation of the first embodiment. The planar shape of the light emitting apparatus 110 according to the variation of the first embodiment is the same as the planar shape of the light emitting apparatus 100 shown in FIG. 2 and will therefore not be shown.

In the light emitting apparatus 110 according to the variation of the first embodiment in the following description, a member having the same function as that of a constituent member of the light emitting apparatus 100 according to the first embodiment described above has the same reference character and will not be described in detail.

The light emitting apparatus 110 differs from the light emitting apparatus 100 described above in that the laminate 20 includes a plurality of columnar sections 4 and the light emitter 2 is formed of the plurality of columnar sections 4, as shown in FIG. 9. In the light emitting apparatus 110, the light emitting device 1 is, for example, a semiconductor laser based on a nano-structural element.

The laminate 20 includes a buffer layer 21. The buffer layer 21 is provided on the principal surface 11 of the first base 10. The buffer layer 21 is provided between the first semiconductor layer 22 and the first base 10. The buffer layer 21 is, for example, an undoped GaN layer.

The columnar sections 4 are provided on the buffer layer 21. The columnar sections 4 are provided at a plurality of locations. The columnar sections 4 each have, for example, a circular or polygonal (hexagonal, for example) cross-sectional shape (cross-sectional shape in direction perpendicular to lamination direction). The columnar sections 4 each have, for example, a nanometer-order diameter (the diameter of the inscribed circle in the case where columnar sections 4 each have a polygonal shape), specifically, the diameter is greater than or equal to 10 nm but smaller than or equal to 500 nm. The columnar sections 4 are also called, for example, nano-columns, nano-wires, nano-rods, and nano-pillars. The size of the columnar sections 4 in the lamination direction is, for example, greater than or equal to 0.1 µm but smaller than or equal to 5 µm. The plurality of columnar sections 4 are separate from each other. The distance between adjacent columnar sections 4 is, for example, greater than or equal to 1 nm but smaller than or equal to 500 nm.

The columnar sections 4 each include the first semiconductor layer 22, the light emitting layer 24, and the second semiconductor layer 26.

The plurality of columnar sections 4 are arranged in a predetermined direction at predetermined intervals in the plan view.

In the light emitting device 1, the semiconductor layers 22 and 26 cause the light produced in the light emitting layer 24 to propagate in the directions perpendicular to the lamination direction. The light forms a standing wave in the directions perpendicular to the lamination direction in the columnar sections 4. The light receives gain in the light emitting layer 24, resulting in laser oscillation. Thereafter, positive first-order diffracted light and negative first-order diffracted light (light L) travel in the lamination direction, pass through the first base 10, to exit.

A coupling member 28, which is connected to each of adjacent columnar sections 4 (which couples adjacent columnar sections 4 to each other), is provided between the adjacent columnar sections 4. The coupling members 28 are each continuous between the adjacent columnar sections 4. The coupling members 28 are each a buried layer buried in the space between the adjacent columnar sections 4. In the example shown in the figure, the coupling members 28 fill the entire spaces between the adjacent columnar sections 4. In the present embodiment, the state in which the coupling members 28 each couple the adjacent columnar sections 4 to each other or the coupling members 28 are each connected to each of the adjacent columnar sections 4 is an expression including a state in which the coupling members 28 are each buried in the space between the adjacent columnar sections 4.

Providing the coupling members 28 between adjacent columnar sections 4 can improve the strength of the columnar sections 4. Therefore, when the light emitting device 1 is mounted on the second base 50, the thus provided coupling members 28 can reduce possibility of an unstable light emission characteristic or breakage of the columnar sections 4 due to defects or dislocation in the columnar sections 4 resulting from stress or strain induced in the columnar sections 4 by pressure acting thereon. Further, after the mounting, the coupling members 28 can reduce possibility of an unstable light emission characteristic or breakage of the columnar sections 4 due to defects or dislocation in the columnar sections 4 resulting from stress induced in the columnar sections 4 by a difference in the coefficient of thermal expansion between the light emitting device 1 and the second base 50 in a case where the temperature in the environment changes, that is, a change, for example, in temperature of the environment and transmitted from the second base 50, the first electrode 30, the second electrode 40, or the bonding members 70 and 72 to the columnar sections 4. A reliable light emitting apparatus having a stable light emission characteristic can therefore be achieved.

Although not shown, the coupling members 28 may each contain an air gap. In the example shown in the figure, the coupling members 28 are each provided across the entire space between adjacent columnar sections 4 and may instead each be provided in part of the space between adjacent columnar sections 4. That is, part of the space between adjacent columnar sections 4 only needs to be filled with the coupling member 28. Also in this case, the strength of the columnar sections 4 can be increased as compared with a case where no coupling member 28 is provided (a case where the space between adjacent columnar sections 4 is an air gap)

The coupling members 28 are transparent to the light produced in the light emitting layer 24 and allow the light produced in the light emitting layer 24 to propagate. The refractive index of the coupling members 28 is closer to the refractive index of the light emitting layer 24 than, for example, the refractive index of air (air gap). That is, the difference in refractive index between the light emitting layer 24 and the coupling members 28 is smaller than the difference in refractive index between the coupling members 28 and air. The refractive index of the coupling members 28 is lower than, for example, the refractive indices of the semiconductor layers 22 and 26 and the light emitting layer 24.

The coupling members 28 are made, for example, of an insulating material. The material of the coupling members 28 is, for example, GaN, InGaN, $TiO_2$, $SiO_2$, or SiON. The coupling members 28 may instead be made of polyimide. Although not shown, the coupling members 28 may each be formed of a plurality of layers. For example, a portion of each of the coupling members 28 that is the portion in contact with a columnar section 4 may be an insulating layer, and a portion of the coupling member 28 that is the portion in no contact with the columnar section 4 (area insulated by insulating layer from columnar section 4) may be an electrically conductive layer or a semiconductor layer made, for example, of p-type GaN.

The above description has been made of the case where the light emitting device 1 is a semiconductor laser using a nano-structural element, and the light emitting device 1 may instead be a super-luminescent diode using a nano-structural element or an LED using a nano-structural element.

The light emitting apparatus 110 can provide the same working effects as those provided by the light emitting apparatus 100 described above.

Further, in the light emitting apparatus 110, the laminate 20 includes a plurality of columnar sections 4, and the light emitter 2 is formed of the plurality of columnar sections 4. The light emitting apparatus 110 therefore allows decrease in dislocation and defects that occur in the light emitting layer 24 and the semiconductor layers 22 and 26, whereby a high-quality crystal can be provided. The light emitting apparatus 110 can therefore have an excellent light emission characteristic.

1.3.2. Method for Manufacturing Light Emitting Apparatus

A method for manufacturing the light emitting apparatus 110 according to the variation of the first embodiment will next be described. FIGS. 10 to 12 are cross-sectional views diagrammatically showing the steps of manufacturing the light emitting apparatus 110 according to the variation of the first embodiment.

The method for manufacturing the light emitting apparatus 110 includes the step of forming the laminate 20 (S10), the step of forming the first electrode 30 and the second electrode 40 (S12), and the mounting step (S14), as does the method for manufacturing the light emitting apparatus 100 shown in FIG. 3.

(1) Formation of Laminate (S10)

The laminate 20 including the light emitter 2 is first formed on the principal surface 11 of the first base 10.

Specifically, the buffer layer 21 is first epitaxially grown on the principal surface 11 of the first base 10, as shown in FIG. 10. A mask layer (not shown) is then formed on the buffer layer 21. The mask layer is, for example, a silicon oxide layer, a silicon oxynitride layer, an aluminum oxide layer, a hafnium oxide layer, a titanium layer, a titanium oxide layer, a zirconium oxide layer, a silicon nitride layer, or a film that is a laminate thereof. The mask layer is formed, for example, by film deposition based on sputtering, evaporation, or any other method and patterning based on photolithography and etching.

The mask layer is then used as a mask to epitaxially grow the first semiconductor layer 22, the light emitting layer 24, and the second semiconductor layer 26 in the presented order on the buffer layer 21 based on MOCVD, MBE, or any other method. The plurality of columnar sections 4 can thus be formed.

The coupling members 28 are then each formed between adjacent columnar sections 4. The coupling members 28 are buried in the spaces between adjacent columnar sections 4. In a case where the coupling members 28 are made, for example, of SOG (spin on glass) or polyimide, the coupling members 28 are formed by spin coating or any other method, whereas in a case where the coupling members 28 are made of an oxide, such as $TiO_2$, the coupling members 28 are formed by atomic layer deposition (ALD) or any other method. In a case where the coupling members 28 are each formed of a semiconductor layer made, for example, of GaN or InGaN, the coupling members 28 are formed by MOCVD or any other method.

The columnar sections 4, the buffer layer 21, and the coupling members 28 are then patterned, as shown in FIG. 11. In this process, the area 12, where the first base 10 is exposed, is formed on the principal surface 11 of the first base 10. Further, the area 23, where the first semiconductor layer 22 is exposed, is formed on the first semiconductor layer 22. The laminate 20 can be formed by carrying out the steps described above.

(2) Formation of First and Second Electrodes (S12)

Thereafter, the first electrode 30 is formed on the first base 10 (area 12) and on the first semiconductor layer 22 (area 23), and the second electrode 40 is formed on the laminate 20 (on second semiconductor layer 26), as shown in FIG. 12. The way in which the present step is carried out is the same as the way in which the step of forming the first electrode 30 and the second electrode 40 (S12) in the method for manufacturing the light emitting apparatus 100 described above is carried out. The light emitting device 1 can be formed by carrying out the step described above.

(3) Mounting (S14)

The light emitting device 1 is mounted on the second base 50, as shown in FIG. 9. The way in which the present step is carried out is the same as the way in which the mounting step (S14) in the method for manufacturing the light emitting apparatus 100 described above is carried out.

The light emitting apparatus 110 can be manufactured by carrying out the steps described above.

The method for manufacturing the light emitting apparatus 110 according to the present embodiment can provide the same working effects as those provided by the method for manufacturing the light emitting apparatus 100 described above.

2. Second Embodiment 2.1. Light Emitting Apparatus

A light emitting apparatus according to a second embodiment will next be described with reference to the drawings. FIG. 13 is a cross-sectional view diagrammatically showing a light emitting apparatus 200 according to the second embodiment. The planar shape of the light emitting apparatus 200 according to the second embodiment is the same as the planar shape of the light emitting apparatus 100 shown in FIG. 2 and will therefore not be shown.

In the light emitting apparatus 200 according to the second embodiment in the following description, a member having the same function as that of a constituent member of the light emitting apparatus 100 according to the first embodiment described above has the same reference character and will not be described in detail.

In the light emitting apparatus 100 described above, the bonding members 70 and 72 shown in FIG. 1 are each solder. In contrast, in the light emitting apparatus 200, the bonding members 70 and 72 are each electrically conductive paste, as shown in FIG. 13.

The electrically conductive paste used as the bonding members 70 and 72 is, for example, silver paste. Silver paste is paste containing nano-size silver particles. Paste containing metal particles other than silver particles may instead be used as the bonding members 70 and 72.

In the light emitting apparatus 100 described above, the height H30 of the first electrode 30 is equal to the sum of the height H20 of the laminate 20 and the height H40 of the second electrode 40 (H20+H40), as shown in FIG. 1, whereas in the light emitting apparatus 200, the height H30 of the first electrode 30 is not limited to a specific value. In the example shown in the figure, the height H30 of the first electrode 30 is smaller than the sum of the height H20 of the laminate 20 and the height H40 of the second electrode 40 (H20+H40).

The light emitting apparatus 200 can provide the same working effects as those provided by the light emitting apparatus 100 described above.

2.2. Method for manufacturing light emitting apparatus A method for manufacturing the light emitting apparatus 200 according to the present embodiment will next be described. FIGS. 14 to 16 are cross-sectional views diagrammatically showing the steps of manufacturing the light emitting apparatus 200 according to the second embodiment.

The method for manufacturing the light emitting apparatus 200 includes the step of forming the laminate 20 (S10), the step of forming the first electrode 30 and the second electrode 40 (S12), and the mounting step (S14), as does the method for manufacturing the light emitting apparatus 100 shown in FIG. 3.

(1) Formation of Laminate (S10)

The laminate 20 including the light emitter 2 is first formed on the principal surface 11 of the first base 10. The way in which the present step is carried out is the same as the way in which the step of forming the laminate 20 (S10) in the method for manufacturing the light emitting apparatus 100 described above is carried out.

(2) Formation of First and Second Electrodes (S12)

Thereafter, the first electrode 30 is formed on the first base 10 (area 12) and on the first semiconductor layer 22 (area 23), and the second electrode 40 is formed on the laminate 20 (on second semiconductor layer 26), as shown in FIG. 14.

The way in which the present step is carried out is the same as the way in which the step of forming the first electrode 30 and the second electrode 40 (S12) in the method for manufacturing the light emitting apparatus 100 described above is carried out except that the height H30 of the first electrode 30 is so formed as to be smaller than the sum of the height H20 of the laminate 20 and the height H40 of the second electrode 40 (H20+H40). The light emitting device 1 can be formed by carrying out the step described above.

(3) Mounting (S14)

The laminate 20 (second electrode 40) and the first electrode 30 formed on the first base 10 are then connected to the second base 50 to mount the light emitting device 1 on the second base 50.

In the present step, the mounting is so performed that a surface of the laminate 20 that is the surface opposite to the first base 10 is connected to the second base 50 (junction-down mounting).

Specifically, the electrically conductive paste is first screen-printed on the first electrode 30 and the second electrode 40 and then burned to form bumps 70*a* and 72*a*, as shown in FIG. 15. The bumps 70*a* and 72*a* are then scraped with a grinding or cutting tool to planarize the surfaces of the bumps in such a way that the height of the bump 70*a* is equal to the sum of the height of the laminate 20, the height of the second electrode 40, and the height of the bump 72*a*. The first electrode 30 and the second base 50 (first wiring 60) can therefore be reliably connected (bonded) to each other, and so are the second electrode 40 and the second base 50 (second wiring 62).

Thereafter, the first wiring 60 and the second wiring 62 are formed on the principal surface 51 of the second base 50, and the through electrodes 64 are formed through the second base 50, as shown in FIG. 16. Electrically conductive paste 70*b* and electrically conductive paste 72*b* are then screen-printed or applied onto the first wiring 60 and the second wiring 62.

The electrically conductive paste 70*b* and 72*b* are then burned in a state in which the light emitting device 1 is so disposed on the second base 50 that the bump 70*a* is located on the first wiring 60 via the electrically conductive paste 70*b* and the bump 72*a* is located on the second wiring 62 via the electrically conductive paste 72*b*, as shown in FIG. 13. As a result, the first electrode 30 is connected (bonded) to the first wiring 60 via the bonding member 70, and the second electrode 40 is connected (bonded) to the second wiring 62 via the bonding member 72. At this point, the bump 70*a* and the electrically conductive paste 70*b* form the bonding member 70, and the bump 72*a* and the electrically conductive paste 72*b* form the bonding member 72. Performing the bonding in an inert gas atmosphere allows the space that accommodates the laminate 20 to have the inert gas atmosphere.

Since force applied when the light emitting device 1 is mounted on the second base 50 in the present step is distributed to the laminate 20 and the first electrode 30, pressure acting on the laminate 20 (light emitter 2) at the time of the mounting can be lowered.

The present step allows the light emitting device 1 to be mounted on the second base 50 and the laminate 20 to be airtightly encapsulated by the first electrode 30, the first base 10, and the second base 50.

The light emitting apparatus 200 can be manufactured by carrying out the steps described above.

The method for manufacturing the light emitting apparatus 200 according to the present embodiment can provide the same working effects as those provided by the method for manufacturing the light emitting apparatus 100 described above.

2.3. Variation of Light Emitting Apparatus 2.3.1. Light Emitting Apparatus

A light emitting apparatus according to a variation of the second embodiment will next be described with reference to the drawings. FIG. 17 is a cross-sectional view diagrammatically showing a light emitting apparatus 210 according to the variation of the second embodiment. The planar shape of the light emitting apparatus 210 according to the variation of the second embodiment is the same as the planar shape of the light emitting apparatus 100 shown in FIG. 2 and will therefore not be shown.

In the light emitting apparatus 210 according to the variation of the second embodiment in the following description, a member having the same function as that of constituent members of the light emitting apparatuses 110 and 200 described above has the same reference character and will not be described in detail.

The light emitting apparatus 210 differs from the light emitting apparatus 200 described above in that the laminate 20 includes a plurality of columnar sections 4 and the light emitter 2 is formed of the plurality of columnar sections 4, as shown in FIG. 17. In the light emitting apparatus 210, the light emitting device 1 is, for example, a semiconductor laser based on a nano-structural element.

In the light emitting apparatus 210, the configuration of the laminate 20 is the same as the configuration of the laminate 20 of the light emitting apparatus 100 described above (see FIG. 9).

The light emitting apparatus 210 can provide the same working effects as those provided by the light emitting apparatus 200 described above. Further, the light emitting apparatus 210 can have an excellent light emission characteristic, as does the light emitting apparatus 110 described above.

2.3.2. Method for Manufacturing Light Emitting Apparatus

A method for manufacturing the light emitting apparatus 210 according to the present variation will next be described. The method for manufacturing the light emitting apparatus 210 includes the step of forming the laminate 20 (S10), the step of forming the first electrode 30 and the second electrode 40 (S12), and the mounting step (S14), as does the method for manufacturing the light emitting apparatus 100 shown in FIG. 3.

The way in which the step of forming the laminate 20 (S10) is carried out is the same as the way in which the step of forming the laminate 20 (S10) in the method for manufacturing the light emitting apparatus 110 described above is carried out. The way in which the step of forming the first electrode 30 and the second electrode 40 (S12) and the mounting step (S14) are carried out is the same as the way in which the step of forming the first electrode 30 and the second electrode 40 (S12) and the mounting step (S14) in the method for manufacturing the light emitting apparatus 200 described above are carried out.

The method for manufacturing the light emitting apparatus 210 according to the present variation can provide the same working effects as those provided by the method for manufacturing the light emitting apparatus 200 described above.

3. Third Embodiment

3.1. Light Emitting Apparatus

A light emitting apparatus according to a third embodiment will next be described with reference to the drawings. FIG. 18 is a cross-sectional view diagrammatically showing a light emitting apparatus 300 according to the third embodiment. FIG. 19 is a plan view diagrammatically showing the light emitting apparatus 300 according to the third embodiment. FIG. 18 is a cross-sectional view taken along the line XVIII-XVIII in FIG. 19.

In the light emitting apparatus 300 according to the third embodiment in the following description, a member having the same function as that of constituent members of the light emitting apparatuses 100 according to the first embodiment and the light emitting apparatuses 200 according to the second embodiment described above has the same reference character and will not be described in detail.

The light emitting apparatus 300 differs from the light emitting apparatus 100 described above in that the light emitting apparatus 300 includes an encapsulating member 80 (second member), which is provided between the first base 10 and the second base 50 and surrounds the circumferences of the first electrode 30 and the laminate 20, as shown in FIGS. 18 and 19.

The encapsulating member 80 has one end connected to the first base 10 and another end connected to the second base 50. The encapsulating member 80 and the first base 10 are so connected to each other that the encapsulating member 80 is directly bonded to the first base 10. The encapsulating member 80 and the second base 50 are so connected to each other that the encapsulating member 80 is bonded to the first wiring 60 provided on the second base 50. The encapsulating member 80 is made, for example, of low-melting-point glass.

The encapsulating member 80 surrounds the circumferences of the first electrode 30 and the laminate 20 in the plan view, as shown in FIG. 19. In the light emitting apparatus 300, the encapsulating member 80, which surrounds the circumference of the first electrode 30, the first base 10, which is connected to one end of the encapsulating member 80, and the second base 50, which is connected to the other end of the encapsulating member 80, form a space that airtightly accommodates the first electrode 30 and the laminate 20. That is, the first electrode 30 and the laminate 20 are airtightly encapsulated by the encapsulating member 80, the first base 10, and the second base 50.

In the light emitting apparatus 300, the laminate 20 is surrounded by the first electrode 30, and the first electrode 30 is surrounded by the encapsulating member 80. That is, the laminate 20 is surrounded and encapsulated by the first electrode 30 and the encapsulating member 80 in a two-fold manner. The light emitting apparatus 300 therefore allows a further increase in the airtightness of the space that accommodates the laminate 20.

The light emitting apparatus 300 can provide the same working effects as those provided by the light emitting apparatus 100 described above.

Further, in the light emitting apparatus 300, the encapsulating member 80 is provided between the first base 10 and the second base 50, one end of the encapsulating member 80 is connected to the first base 10, and the other end of the encapsulating member 80 is connected to the second base 50. Therefore, in the light emitting apparatus 300, force applied when the light emitting device 1 is mounted on the second base 50 is distributed to the laminate 20, the first electrode 30, and the encapsulating member 80. The light emitting apparatus 300 therefore allows pressure acting on the laminate 20 (light emitter 2) to further lower when the light emitting device 1 is mounted. As a result, the possibility of stress and strain induced in the light emitter 2 (laminate 20) can be reduced, whereby a reliable light emitting apparatus having a stable light emission characteristic can be achieved.

Further, in the light emitting apparatus 300, the encapsulating member 80 is so provided as to surround the circumferences of the first electrode 30 and the laminate 20. The light emitting apparatus 300 can therefore prevent the force acting when the light emitting device 1 is mounted from concentrating on the laminate 20, whereby the pressure acting on the light emitter 2 at the time of the mounting can be lowered.

Further, in the light emitting apparatus 300, the first electrode 30 and the laminate 20 are airtightly encapsulated by the encapsulating member 80, the first base 10, and the second base 50. That is, the laminate 20 is encapsulated in a two-fold manner in the light emitting apparatus 300. The light emitting apparatus 300 therefore allows a further increase in the airtightness of the space that accommodates the laminate 20.

In the light emitting apparatus 300, the encapsulating member 80 for encapsulating the first electrode 30 and the laminate 20 functions as a member (second member) for lowering the pressure acting on the light emitter 2 when the light emitting device 1 is mounted. Therefore, in the light emitting apparatus 300, the pressure acting on the light emitter 2 at the time of the mounting can be lowered with no increase in the number of parts.

3.2. Method for Manufacturing Light Emitting Apparatus

A method for manufacturing the light emitting apparatus 300 according to the third embodiment will next be described with reference to the drawings. FIG. 20 is a flowchart showing an example of the method for manufacturing the light emitting apparatus 300 according to the third embodiment. FIG. 21 is a cross-sectional view diagrammatically showing one of the steps of manufacturing the light emitting apparatus 300 according to the third embodiment.

(1) Formation of Laminate (S20)

The laminate 20 including the light emitter 2 is first formed on the principal surface 11 of the first base 10. The way in which the present step is carried out is the same as the way in which the step of forming the laminate 20 (S10) in the method for manufacturing the light emitting apparatus 100 described above is carried out.

(2) Formation of First and Second Electrodes (S22)

Thereafter, the first electrode 30 is formed on the first base 10 (area 12) and on the first semiconductor layer 22 (area 23), and the second electrode 40 is formed on the laminate 20 (on second semiconductor layer 26). The way in which the present step is carried out is the same as the way in which the step of forming the first electrode 30 and the second electrode 40 (S12) in the method for manufacturing the light emitting apparatus 100 described above is carried out. The light emitting device 1 can be formed by carrying out the step described above (see FIG. 7).

(3) Formation of Encapsulating Member (S24)

The encapsulating member 80 is then formed on the principal surface 51 of the second base 50, as shown in FIG. 21. Specifically, glass frit is applied onto the principal surface 51 of the second base 50, and the glass frit is burned to form the encapsulating member 80. Burning the glass frit in advance as described above to evaporate a solvent in the glass frit can prevent the solvent from being left in the space encapsulated by the encapsulating member 80. It is noted that the first wiring 60, the second wiring 62, and the through electrodes 64 are formed in advance in the second base 50.

(4) Mounting (S26)

The light emitting device 1 is then mounted on the second base 50, as shown in FIGS. 18 and 19.

Specifically, the first electrode 30 is connected (bonded with solder) to the first wiring 60 via the bonding member 70, and the second electrode 40 is connected (bonded with solder) to the second wiring 62 via the bonding member 72.

The encapsulating member 80 is then irradiated with laser light, so that one end of the encapsulating member 80 is fused to the first base 10 and the other end of the encapsulating member 80 is fused to the second base 50. As a result, one end of the encapsulating member 80 is connected (bonded) to the first base 10, and the other end of the encapsulating member 80 is connected (bonded) to the second base 20. Performing the step in an inert gas atmosphere allows the space that accommodates the first electrode 30 and the laminate 20 to have the inert gas atmosphere.

In the present step, when the light emitting device 1 is mounted on the second base 50, the laminate 20 formed on the first base 10 is pressed against the second base 50, so that pressure acts on the laminate 20. At this point, the first electrode 30 has been formed in addition to the laminate 20 on the first base 10, and the encapsulating member 80 has been formed on the second base 50. The force acting at the time of the mounting is therefore distributed to the laminate 20, the first electrode 30, and the encapsulating member 80, whereby the pressure acting on the laminate 20 (light emitter 2) can be lowered.

The present step allows the light emitting device 1 to be mounted on the second base 50 and the first electrode 30 and the laminate 20 to be airtightly encapsulated by the encapsulating member 80, the first base 10, and the second base 50.

The coupling (bonding) between the first electrode 30 and the first wiring 60, the coupling (bonding) between the second electrode 40 and the second wiring 62, and the coupling (fusing) between the encapsulating member 80 and the bases 10 and 50 may be performed simultaneously. That is, the bonding members 70 and 72 (AuSn solder, for example) and the encapsulating member 80 (low-melting-point glass) may be heated simultaneously, and the coupling (bonding and fusing) between the components described above may be performed simultaneously.

The light emitting apparatus 300 can be manufactured by carrying out the steps described above.

The method for manufacturing the light emitting apparatus 300 according to the present embodiment can provide the same working effects as those provided by the method for manufacturing the light emitting apparatus 100 described above.

Further, in the method for manufacturing the light emitting apparatus 300 according to the present embodiment, the pressure applied by the first electrode 30 and the encapsulating member 80 to the laminate 20 (light emitter 2) can be lowered in the mounting step. The possibility of stress and strain induced in the light emitter 2 (laminate 20) can therefore be reduced, whereby a reliable light emitting apparatus having a stable light emission characteristic can be manufactured.

In the method for manufacturing the light emitting apparatus 300 according to the present embodiment, the encapsulating member 80 is so formed as to surround the circumference of the first electrode 30. Mounting the light emitting device 1 on the second base 50 in junction-down mounting therefore allows the encapsulating member 80 and the first electrode 30 to encapsulate the laminate 20 in a two-fold manner. The airtightness of the space that accommodates the laminate 20 can thus be further increased.

3.3. Variation of Light Emitting Apparatus

A light emitting apparatus according to a variation of the third embodiment will next be described with reference to the drawings. FIG. 22 is a cross-sectional view diagrammatically showing a light emitting apparatus 310 according to the variation of the third embodiment. The planar shape of the light emitting apparatus 310 according to the variation of the third embodiment is the same as the planar shape of the light emitting apparatus 300 shown in FIG. 19 and will therefore not be shown.

In the light emitting apparatus 310 according to the variation of the third embodiment in the following description, a member having the same function as that of constituent members of the light emitting apparatuses 110 and 300 described above has the same reference character and will not be described in detail.

The light emitting apparatus 310 differs from the light emitting apparatus 300 described above in that the laminate 20 includes a plurality of columnar sections 4 and the light emitter 2 is formed of the plurality of columnar sections 4, as shown in FIG. 22. In the light emitting apparatus 310, the light emitting device 1 is, for example, a semiconductor laser based on a nano-structural element.

The configuration of the light emitting apparatus 310 is the same as that of the light emitting apparatus 300 except that the light emitting device 1 in the light emitting apparatus 310 is the light emitting device 1 in the light emitting apparatus 110 described above (see FIG. 9) and will therefore not be described.

The light emitting apparatus 310 can provide the same working effects as those provided by the light emitting apparatus 300 described above. Further, the light emitting apparatus 310 can have an excellent light emission characteristic, as does the light emitting apparatus 110 described above.

4. Fourth Embodiment 4.1. Light Emitting Apparatus

A light emitting apparatus according to a fourth embodiment will next be described with reference to the drawings. FIG. 23 is a cross-sectional view diagrammatically showing a light emitting apparatus 400 according to the fourth embodiment. The planar shape of the light emitting apparatus 400 according to the fourth embodiment is the same as the planar shape of the light emitting apparatus 300 shown in FIG. 19 and will therefore not be shown.

In the light emitting apparatus 400 according to the fourth embodiment in the following description, a member having the same function as that of constituent members of the light emitting apparatuses 100, 200, and 300 described above has the same reference character and will not be described in detail.

The light emitting apparatus 400 differs from the light emitting apparatus 200 described above in that the light emitting apparatus 400 includes the encapsulating member 80 (second member), which is provided between the first base 10 and the second base 50 and surrounds the circumferences of the first electrode 30 and the laminate 20, as shown in FIG. 23.

The configuration of the light emitting apparatus 400 is the same as the configuration of the light emitting apparatus 300 (see FIG. 18) except that the configuration of the light emitting device 1 in the light emitting apparatus 400 is the same as the configuration of the light emitting device 1 in the light emitting apparatus 200 described above (see FIG. 13) and will therefore not be described.

The light emitting apparatus 400 can provide the same working effects as those provided by the light emitting apparatus 300 described above.

4.2. Method for Manufacturing Light Emitting Apparatus

A method for manufacturing the light emitting apparatus 400 according to the fourth embodiment will next be described. The method for manufacturing the light emitting apparatus 400 according to the fourth embodiment can be the combination of the method for manufacturing the light emitting apparatus 200 according to the second embodiment described above and the method for manufacturing the light emitting apparatus 300 according to the third embodiment described above.

The method for manufacturing the light emitting apparatus 400 can provide the same working effects as those provided by the methods for manufacturing the light emitting apparatuses 200 and 300 described above.

4.3. Variation of Light Emitting Apparatus

A light emitting apparatus according to a variation of the fourth embodiment will next be described with reference to the drawings. FIG. 24 is a cross-sectional view diagrammatically showing a light emitting apparatus 410 according to the variation of the fourth embodiment. The planar shape of the light emitting apparatus 410 according to the variation of the fourth embodiment is the same as the planar shape of the light emitting apparatus 300 shown in FIG. 19 and will therefore not be shown.

In the light emitting apparatus 410 according to the variation of the fourth embodiment in the following description, a member having the same function as that of constituent members of the light emitting apparatuses 210 and 400 described above has the same reference character and will not be described in detail.

The light emitting apparatus 410 differs from the light emitting apparatus 400 described above in that the laminate 20 includes a plurality of columnar sections 4 and the light emitter 2 is formed of the plurality of columnar sections 4, as shown in FIG. 24. In the light emitting apparatus 410, the light emitting device 1 is, for example, a semiconductor laser based on a nano-structural element.

The configuration of the light emitting apparatus 410 is the same as that of the light emitting apparatus 400 except that the light emitting device 1 in the light emitting apparatus 410 is the light emitting device 1 in the light emitting apparatus 210 described above (see FIG. 17) and will therefore not be described.

The light emitting apparatus 410 can provide the same working effects as those provided by the light emitting apparatus 400 described above.

Further, the light emitting apparatus 410 can have an excellent light emission characteristic, as does the light emitting apparatus 210 described above.

5. Fifth Embodiment

5.1. Light Emitting Apparatus

A light emitting apparatus according to a fifth embodiment will next be described with reference to the drawings. FIG. 25 is a cross-sectional view diagrammatically showing a light emitting apparatus 500 according to the fifth embodiment. FIG. 26 is a plan view diagrammatically showing the light emitting apparatus 500 according to the fifth embodiment. FIG. 25 is a cross-sectional view taken along the line XXV-XXV in FIG. 26.

In the light emitting apparatus 500 according to the fifth embodiment in the following description, a member having the same function as that of constituent members of the light emitting apparatuses 100, 200, 300, and 400 described above has the same reference character and will not be described in detail.

The light emitting apparatus 500 differs from the light emitting apparatus 400 in that the first electrode 30 is provided with a slit 32, which allows the space which is located inside the first electrode 30 and in which the laminate 20 is accommodated to communicate with the space between the first electrode 30 and the encapsulating member 80, as shown in FIGS. 25 and 26. That is, in the light emitting apparatus 500, the laminate 20 is not encapsulated by the first electrode 30 and is airtightly encapsulated only by the encapsulating member 80.

Since the slit 32 is formed in the first electrode 30, the first electrode 30 does not surround the entire circumference of the laminate 20. The first electrode 30 is so shaped that part of the sidewall of a quadrangular tube that forms the first electrode 30 is cut out. Providing the first electrode 30 with the slit 32 allows reduction in contamination of the laminate 20 (light emitter 2) due to a gas produced from the bonding members 70 and 72 (electrically conductive paste) in a manufacturing step.

Even in the case where the slit 32 is formed in the first electrode 30, the force applied when the light emitting device 1 is mounted on the second base 50 is distributed by the first electrode 30. Therefore, when the light emitting device 1 is mounted, pressure acting on the laminate 20 (light emitter 2) can be lowered also in the present embodiment.

The light emitting apparatus 500 according to the fifth embodiment can provide the same working effects as those provided by the light emitting apparatus 400 described above.

Further, the light emitting apparatus 500 according to the fifth embodiment allows reduction in contamination of the laminate 20 (light emitter 2) due to a gas produced from the bonding members 70 and 72 in a manufacturing step.

5.2. Method for Manufacturing Light Emitting Apparatus

A method for manufacturing the light emitting apparatus 500 according to the fifth embodiment will next be described. The method for manufacturing the light emitting apparatus 500 according to the fifth embodiment differs from the method for manufacturing the light emitting apparatus 400 according to the fourth embodiment described above in that the first electrode 30 is provided with the slit 32 and the gas is exhausted via the slit 32. The differences will be described below.

In the method for manufacturing the light emitting apparatus 500 according to the fifth embodiment, the slit 32 is formed in the first electrode 30 in the step of forming the first electrode 30 and the second electrode 40.

Further, in the mounting step, the space inside the first electrode 30 is evacuated via the slit 32, and the interior of the space is replaced with an inert gas. Specifically, the first electrode 30 and the first wiring 60 are bonded to each other via the bonding member 70 (electrically conductive paste), and the second electrode 40 and the second wiring 62 are bonded to each other via the bonding member 72 (electrically conductive paste). In this process, when the electrically conductive paste is burned, a gas is produced from the bonding members 70 and 72. The gas is then exhausted from the space inside the first electrode 30 via the slit 32 and replaced with an inert gas. The encapsulating member 80 is then so irradiated with laser light that one end of the encapsulating member 80 is fused to the first base 10 and the other end of the encapsulating member 80 is fused to the second base 50. The laminate 20 and the first electrode 30 can thus be airtightly encapsulated.

When the electrically conductive paste is burned, a solvent is vaporized from the electrically conductive paste to form a gas. The gas contaminates the laminate 20 (light emitter 2) in some cases. For example, in a case where the first electrode 30 is provided with no slit 32, the burned electrically conductive paste airtightly encapsulates the space that accommodates the laminate 20, but the gas produced from the electrically conductive paste is undesirably left in the space. In contrast, providing the first electrode 30 with the slit 32 allows removal of the gas produced from the electrically conductive paste. As a result, the contamination of the laminate 20 due to the gas can be reduced.

The method for manufacturing the light emitting apparatus 500 according to the fifth embodiment can provide the same working effects as those provided by the method for manufacturing the light emitting apparatus 400 according to the fourth embodiment.

Further, in the method for manufacturing the light emitting apparatus 500 according to the fifth embodiment, the gas produced from the bonding members 70 and 72 (electrically conductive paste) can be removed via the slit 32 in the mounting step, as described above. The contamination of the laminate 20 (light emitter 2) due to the gas produced from the bonding members 70 and 72 at the time of the mounting can thus be reduced.

5.3. Variation of Light Emitting Apparatus

A light emitting apparatus according to a variation of the fifth embodiment will next be described with reference to the drawings. FIG. 27 is a cross-sectional view diagrammatically showing a light emitting apparatus 510 according to the variation of the fifth embodiment. The planar shape of the light emitting apparatus 510 according to the variation of the fifth embodiment is the same as the planar shape of the light emitting apparatus 500 shown in FIG. 26 and will therefore not be shown.

In the light emitting apparatus 510 according to the variation of the fifth embodiment in the following description, a member having the same function as that of constituent members of the light emitting apparatuses 210 and 500 described above has the same reference character and will not be described in detail.

The light emitting apparatus 510 differs from the light emitting apparatus 500 described above in that the laminate 20 includes a plurality of columnar sections 4 and the light emitter 2 is formed of the plurality of columnar sections 4, as shown in FIG. 27. In the light emitting apparatus 510, the light emitting device 1 is, for example, a semiconductor laser based on a nano-structural element.

The configuration of the light emitting apparatus 510 is the same as that of the light emitting apparatus 500 except that the light emitting device 1 in the light emitting apparatus 510 is the light emitting device 1 in the light emitting apparatus 210 described above (see FIG. 17) and will therefore not be described.

The light emitting apparatus 510 can provide the same working effects as those provided by the light emitting apparatus 500 described above. Further, the light emitting apparatus 510 can have an excellent light emission characteristic, as does the light emitting apparatus 210 described above.

6. Sixth Embodiment

A projector according to a sixth embodiment will next be described with reference to the drawings. FIG. 28 diagrammatically shows a projector 900 according to the sixth embodiment.

The projector according to the disclosure includes any of the light emitting apparatuses according to the disclosure. The following description will be made of a projector 900 including the light emitting apparatus 100 as the light emitting apparatus according to the disclosure.

The projector 900 includes an enclosure (not shown) and red light source 100R, a green light source 100G, and a blue light source 100B, which are provided in the enclosure and output red light, green light, and blue light, respectively. The red light source 100R, the green light source 100G, and the blue light source 100B are each, for example, a plurality of light emitting apparatuses 100 arranged in an array in the directions perpendicular to the lamination direction with the second base 50 being common to the plurality of light emitting apparatuses 100. The number of light emitting apparatuses 100 that form each of the light sources 100R, 100G, and 100B is not limited to a specific number. In FIG. 28, the enclosure that forms the projector 900 is omitted, and further, the light sources 100R, 100G, and 100B are simplified for convenience.

The projector 900 further includes lens arrays 902R, 902G, and 902B, transmissive liquid crystal light valves (light modulators) 904R, 904G, and 904B, and a projection lens (projection apparatus) 908, which are all provided in the enclosure.

The light beams outputted from the light sources 100R, 100G, and 100B are incident on the lens arrays 902R, 902G, and 902B, respectively. The light beams outputted from the light sources 100R, 100G, and 100B can be collected and, for example, superimposed (partially superimposed) on one another by the lens arrays 902R, 902G, and 902B. The liquid crystal light valves 904R, 904G, and 904B can thus each be uniformly irradiated with the corresponding superimposed light beam.

The light beams collected by the lens arrays 902R, 902G, and 902B are incident on the liquid crystal light valves 904R, 904G, and 904B, respectively. The liquid crystal light valves 904R, 904G, and 904B modulate the light beams incident thereon in accordance with image information. The projection lens 908 then enlarges images formed by the liquid crystal light valves 904R, 904G, and 904B and projects the pictures (images) on a screen (display surface) 910.

The projector 900 can further include a cross dichroic prism (color light combiner) 906, which combines the light beams outputted from the liquid crystal light valves 904R, 904G, and 904B with one another and guides the combined light to the projection lens 908.

The three color light beams modulated by the liquid crystal light valves 904R, 904G, and 904B enter the cross dichroic prism 906. The prism is formed by bonding four right-angled prisms to each other, and a dielectric multilayer film that reflects the red light and a dielectric multilayer film that reflects the blue light are disposed in the form of a cross on the inner surfaces of the bonded prisms. The dielectric multilayer films combine the three color light beams with one another to form light representing a color image. The combined light is then projected on the screen 910 vie the projection lens 908, which is a projection system, and an enlarged image is thus displayed.

Video images may instead be directly formed without using the liquid crystal light valves 904R, 904G, and 904B by taking the light emitting apparatuses 100, which form the light sources 100R, 100G, and 100B, as pixels of video images and controlling (modulating) the light emitting apparatus 100 in accordance with image information. The projection lens 908 may then enlarge the video images formed by the light sources 100R, 100G, and 100B and project the enlarged video images on the screen 910.

In the example described above, transmissive liquid crystal light valves have been used as the light modulators. Instead, light valves using no liquid crystal material or reflective light valves may be used. Examples of such light valves may include reflective liquid crystal light valves and digital micromirror devices. The configuration of the projection system is changed as appropriate in accordance with the type of the light valves to be used.

The light sources 100R, 100G, and 100B can be used also in a light source apparatus of a scanning image display apparatus (projector) including a scanner that is an image forming apparatus that displays an image having a desired size on a display surface by causing a screen to be scanned with light beams from the light sources 100R, 100G, and 100B.

7. Others

The disclosure is not limited to the embodiments described above and can be changed in a variety of manners to the extent within the substance of the disclosure.

For example, in the first embodiment described above, the second electrode 40 is bonded to the second base 50 (second wiring 62) to mount the light emitting device 1 in junction-down mounting, as shown in FIG. 1. Instead, the laminate 20 may be provided with a member (such as metal layer) for transmitting heat generated in the light emitter 2 to the second base 50, and the member may be bonded to the second base 50 for the junction-down mounting of the light emitting device 1. In this case, the second electrode 40 may not be bonded to the second base 50. The variation described above can also be applied to the second to fifth embodiments described above.

Further, for example, in the first embodiment described above, the first electrode 30 is connected (bonded) to the second base 50 via the bonding member 70 so that the laminate 20 is airtightly encapsulated, and the pressure acting on the laminate 20 at the time of the mounting is lowered, as shown in FIG. 1. Instead, a member that is separate from the first electrode 30 and has one end connected to the first base 10 and another end connected to the second base 50 (first member) may be provided to lower the pressure acting on the laminate 20 at the time of the mounting. In this case, the member may not necessarily be bonded (glued) to the second base 50 as long as the pressure acting on the laminate 20 at the time of the mounting can be lowered, and the member only needs to be in contact with the second base 50. The member may be an insulating member. The variation described above can also be applied to the second to fifth embodiments described above.

The application of the light emitting apparatuses according to the disclosure is not limited to that presented in the embodiments described above and can be used as a light source of outdoor illumination, a backlight for a display, a laser printer, a scanner, an in-vehicle light, a sensing instrument using light, and a light source of a communication apparatus and the like as well as a projector.

The embodiments and variations described above have been presented by way of example and are not necessarily employed. For example, the embodiments and the variations can be combined with each other as appropriate.

The present disclosure encompasses substantially the same configuration as the configuration described in each of the embodiments (for example, a configuration having the same function, using the same method, and providing the same result or a configuration having the same purpose and providing the same effect). Further, the present disclosure encompasses a configuration in which an inessential portion of the configuration described in each of the embodiments is replaced. Moreover, the present disclosure encompasses a configuration that provides the same working effects as those provided by the configuration described in each of the embodiments or a configuration that can achieve the same purpose as that achieved by the configuration described in each of the embodiments. Further, the present disclosure encompasses a configuration in which a known technology is added to the configuration described in each of the embodiments.

The invention claimed is:

1. A light emitting apparatus comprising:
   a light emitting device configured by a laminated structure, the laminated structure being configured with:
   a first semiconductor layer having a first conductivity type;
   a light emitting layer disposed on the first semiconductor layer, an outer Periphery of the light emitting layer being located inside of an outer periphery of the first semiconductor layer when viewed along a laminated direction of the laminated structure; and
   a second semiconductor laver having a second conductivity type disposed on the light emitting layer, the first conductivity type being different from the second conductivity type, an outer periphery of the second semiconductor laver aligning with the outer periphery of the light emitting laver when viewed along the laminated direction;
   a first base divided into a center area and a peripheral area surrounding the center area, the first semiconductor laver disposed on the center area of the first base;
   a first electrode disposed on the peripheral area of the first base to surround the laminate structure, the first electrode extending along the laminated direction away from the peripheral area of the first base, the first electrode being directly connected to the outer periphery of the first semiconductor layer;
   a second electrode disposed on the second semiconductor layer, an outer periphery of the second electrode aligning with the outer periphery of the second semiconductor laver when viewed along the laminated direction;
   a second base on which the second electrode and the first electrode are provided;
   a space surrounding the light emitting layer, the second semiconductor layer, and the second electrode, the first electrode being spaced apart from the light emitting layer, the second semiconductor layer, and the second electrode via the space, the space extending along the laminated direction between the first semiconductor layer and the second base,
   wherein the laminated structure includes a plurality of columnar sections, and the light emitting layer is formed in each of the plurality of columnar sections.

2. The light emitting apparatus according to claim 1, wherein the first electrode surrounds an entirety of a circumference of the laminated structure.

3. The light emitting apparatus according to claim 2, wherein the laminated structure is airtightly encapsulated by the first electrode, the first base, and the second base.

4. The light emitting apparatus according to claim 1, wherein the first electrode is electrically connected to the first semiconductor layer.

5. The light emitting apparatus according to claim 1, further comprising an encapsulating member provided between the first base and the second base, wherein the encapsulating member has one end connected to the first base and the other end connected to the second base.

6. The light emitting apparatus according to claim 5, wherein the encapsulating member surrounds circumferences of the first electrode, the second electrode, and the laminated structure.

7. The light emitting apparatus according to claim 1, wherein the second base has a through hole in which a through electrode extends.

8. The light emitting apparatus according to claim 7, wherein the second semiconductor layer is electrically connected to the through electrode via the second electrode.

9. The light emitting apparatus according to claim 1, wherein the first electrode is connected to the second base via a bonding member.

10. A projector comprising the light emitting apparatus according to claim 1.

11. A method for manufacturing a light emitting apparatus, the method comprising the steps of:
    forming a light emitting device configured by a laminated structure at a first base, the laminated structure being configured with:
        a first semiconductor layer having a first conductivity type;
        a light emitting layer disposed on the first semiconductor layer, an outer periphery of the light emitting layer being located inside of an outer periphery of the first semiconductor layer when viewed along a laminated direction of the laminated structure; and
        a second semiconductor layer having a second conductivity type disposed on the light emitting layer, the first conductivity type being different from the second conductivity type, an outer periphery of the second semiconductor layer aligning with the outer periphery of the light emitting layer when viewed along the laminated direction, wherein the first base is divided into a center area and a peripheral area surrounding the center area, and the first semiconductor layer is disposed on the center area of the first base;
    forming a first electrode on the peripheral area of the first base to surround the laminate structure, the first electrode extending along the laminated direction away from the peripheral area of the first base, the first electrode being directly connected to the outer periphery of the first semiconductor layer;
    forming a second electrode on the second semiconductor layer, an outer periphery of the second electrode aligning with the outer periphery of the second semiconductor layer when viewed along the laminated direction; and
    coupling the laminated structure and the first electrode that are formed on the first base to a second base,
    wherein the laminated structure includes a plurality of columnar sections, and the light emitting layer is formed in each of the plurality of columnar sections,
    the first electrode is spaced apart from the light emitting layer, the second semiconductor layer, and the second electrode via a space, and the space surrounds the light emitting layer, the second semiconductor layer, and the second electrode, and
    the space extends along the laminated direction between the first semiconductor layer and the second base.

12. A light emitting device configured by a laminated structure, the laminated structure being configured with:
    a first semiconductor layer having a first conductivity type;
    a light emitting layer disposed on the first semiconductor layer, an outer periphery of the light emitting layer being located inside of an outer periphery of the first semiconductor layer when viewed along a laminated direction of the laminated structure;
    a second semiconductor layer having a second conductivity type disposed on the light emitting layer, the first conductivity type being different from the second conductivity type;
    a first base on which the first semiconductor layer is disposed;
    a first electrode extending along the laminated direction away from the first base;
    a second electrode disposed on the second semiconductor layer; and
    a second base on which the second electrode and the first electrode are provided, the second base having a first wiring and a second wiring,
    wherein the second electrode is connected to the second wiring,
    one end of the first electrode is connected to both the first semiconductor layer and the first base,
    the other end of the first electrode is connected to the first wiring, and
    a part of the first semiconductor layer is disposed between the first electrode and the first base.

* * * * *